United States Patent
Yoshizawa et al.

(10) Patent No.: US 7,495,745 B2
(45) Date of Patent: Feb. 24, 2009

(54) PATTERNING METHOD AND COMPUTER READABLE MEDIUM THEREFOR

(75) Inventors: Keiji Yoshizawa, Nagano (JP);
Toshinori Koyama, Nagano (JP);
Masatoshi Akagawa, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 11/812,450

(22) Filed: Jun. 19, 2007

(65) Prior Publication Data
US 2008/0123070 A1 May 29, 2008

(30) Foreign Application Priority Data
Jun. 20, 2006 (JP) .................... P. 2006-170507

(51) Int. Cl.
*G03B 27/32* (2006.01)
*G03B 27/42* (2006.01)
(52) U.S. Cl. ............................... 355/77; 355/53
(58) Field of Classification Search .............. 355/52, 355/53, 55, 67, 77; 430/5, 20, 30, 311
See application file for complete search history.

(56) References Cited

U.S. PATENT DOCUMENTS

| | | | | |
|---|---|---|---|---|
| 7,280,129 B2* | 10/2007 | Takada | ........................ | 347/235 |
| 7,365,285 B2* | 4/2008 | Toida | .................... | 219/121.65 |
| 2005/0041229 A1* | 2/2005 | Meisburger | .................. | 355/53 |

FOREIGN PATENT DOCUMENTS

| | | |
|---|---|---|
| JP | 10-112579 | 4/1998 |
| JP | 2004-9595 | 1/2004 |
| JP | 2005-300805 | 10/2005 |

* cited by examiner

*Primary Examiner*—Hung Henry Nguyen
(74) *Attorney, Agent, or Firm*—Drinker Biddle & Reath LLP

(57) ABSTRACT

A patterning method performed by a direct patterning apparatus, and a computer readable medium for controlling a computer of the direct patterning apparatus to perform the pattering method. The patterning method forms a desired pattern on the surface of the object by exposing the surface of the object to light by using a plurality of spatial light modulation elements installed in a direction perpendicular to the relative moving direction of the object, so that a defective resolution does not occur on the surface of the object.

10 Claims, 19 Drawing Sheets

PATTERNING METHOD AND COMPUTER READABLE MEDIUM THEREFOR

This application claims foreign priority based on Japanese Patent application No. 2006-170507, filed Jun. 20, 2006, the content of which is incorporated herein by reference in its entirety.

BACKGROUND OF THE INVENTION

1. Field of the Invention

The present invention relates to a patterning method and a computer readable medium therefor in a direct patterning apparatus (the apparatus that performs patterning without using a mask) which forms a desired pattern on a surface of an object (patterning target) by exposing the surface of the object to light by using a plurality of spatial light modulation elements installed and assigned to respective exposure areas defined along a relative moving direction of the object.

2. Description of the Related Art

A direct patterning apparatus for exposing an object by using spatial light modulation elements such as a digital micromirror device (DMD), that is, a maskless exposure apparatus performs an exposure process to form a pattern on the surface of an object substrate by moving the object substrate relatively in one direction with respect to the patterning apparatus at a regular transfer speed while changing the pattern being output from the spatial light modulation elements in accordance with the relative movement, in order to continuously expose the object substrate (object) having a large patterning area (for example, see JP-A-2005-300805 for reference). In this case, an area on which one spatial light modulation element can perform the patterning at one time in a direction perpendicular to the relative moving direction (transfer direction) of the object substrate is limited. Thus, the plurality of spatial light modulation elements are aligned in the direction perpendicular to the transfer direction of the object substrate, so that the direct patterning apparatus can evenly perform the patterning on the object in that direction.

When directly exposing a resist formed on the object substrate, the maskless exposure apparatus using the digital micromirror device creates pattern data corresponding to patterns for exposure, inputs the pattern data to the digital micromirror device, and moves each of a plurality of micromirrors in the digital micromirror device in a tilted manner in accordance with the pattern data. In this manner, the maskless exposure apparatus forms exposure patterns corresponding to the pattern data, by appropriately changing a direction of reflected light coming from each micromirror obtained by projecting light onto the digital micromirror device, and exposing the resist on the object substrate to the light (for example, see JP-A-10-112579 for reference).

The micromirrors of the digital micromirror device are aligned two-dimensionally, so that the alignment direction of each column is perpendicular to that of each row (for example, see JP-A-2004-009595 for reference). It is possible to perform the exposure process with more minute resolution than a pitch between the micromirrors of the digital micromirror device, by tilting the micromirror rows (or columns) of the digital micromirror device mounted on a patterning head for a predetermined angle with respect to the relative moving direction of the object substrate (that is, a scanning direction of a stage on which the object substrate is mounted). In this case, the tilting angle of the micromirrors of the digital micromirror device is appropriately determined, so that one point on the surface of the object substrate is exposed to light for a plurality of times by the plurality of micromirrors positioned apart from each other at an approximately regular interval on the scanning lines. A non-uniform irradiance in the digital micromirror device and a non-uniform irradiance between different digital micromirror devices can be suppressed by the multiple exposure by the plurality of micromirrors.

In the direct patterning apparatus, an image formed by the digital micromirror device is distorted due to lens aberration and error in assembling lens of an optical system mounted on the patterning head with the digital micromirror device, and thus position displacement of spots occurs at the time of the multiple exposure.

FIGS. 18A to 18D are schematic diagrams illustrating the position displacement of spots at the time of the multiple exposure, which can occur in the direct patterning apparatus using the digital micromirror device. In FIGS. 18A to 18D, each white circle denotes the corresponding irradiation spot formed on the object substrate by each micromirror. In an ideal case where there is no lens aberration, no error in assembling the lens, or the like of the optical system mounted on the patterning head of the direct patterning apparatus, the distortion does not occur in the image on the surface of the object substrate, and the irradiation spots are formed at the regular interval on the same scanning lines L by the micromirrors, as shown in FIG. 18A. However, as described above, the lens aberration, the error in assembling the lens, or the like practically occurs in the optical system. Consequently, as shown in FIGS. 18B to 18D, the distortion occurs in the image on the surface of the object substrate, and thus position displacements of the irradiation spots formed by the micromirrors occur. Likewise, due to the position displacements of the irradiation spots formed by the micromirrors, the interval between the irradiation spots on the same scanning lines L formed by the micromirrors becomes irregular. Since the optical system is individually mounted on each patterning head, the position displacement of the irradiation spot formed by the micromirrors becomes different for every patterning head, that is, every digital micromirror device. Consequently, an exposure amount (that is, an accumulated amount of irradiation of light) in one irradiation spot obtained by the multiple exposure by the plurality of micromirrors is different for every digital micromirror device as shown in FIGS. 18B to 18D.

FIG. 19 is a diagram illustrating one example of irradiance distribution of light by the digital micromirror devices in the direct patterning apparatus. As shown in the drawing, three digital micromirror devices D1, D2, and D3 are aligned in a direction nearly perpendicular to the relative moving direction of the object substrate (indicated by a thick arrow in the drawing). In the drawing, white circles and black circles each represent the micromirrors aligned two-dimensionally in the digital micromirror devices. Each of the digital micromirror devices D1, D2, and D3 is mounted on each patterning head of the direct patterning apparatus, so that the rows (or columns) of the micromirrors aligned two-dimensionally are tilted for a predetermined angle with respect to the relative moving direction of the object substrate.

Black circles shown in FIG. 19 denote the micromirrors positioned in the vicinity of joint portions (hereinafter, referred to as "stitch portions") of alignment planes of the micromirrors of the digital micromirror devices D1, D2, and D3. Irradiance of light at the stitch portions of the digital micromirror device is reduced due to the lens aberration, the error in assembling the lens, or the like described in by referring to FIGS. 18B to 18D, compared to the vicinity of the center of the digital micromirror device. The exposure irregularity occurs on the object substrate due to the irregularity of the irradiance distribution of light.

FIG. 20 is a diagram illustrating a relationship between the exposure irregularity and defective resolution of the direct patterning apparatus using the digital micromirror devices. As shown in the drawing, three digital micromirror devices D1, D2, and D3 are aligned in a direction nearly perpendicular to the relative moving direction (indicated by a thick arrow in the drawing) of an object substrate P. In the drawing, the white circles and the black circles respectively represent the micromirrors aligned two-dimensionally in the digital micromirror devices, and the black circles especially represent the micromirrors existing in the vicinity of the stitch portions of the digital micromirror devices D1, D2, and D3.

As one example, a case will be described where pieces Q1 to Q8 to be semiconductor packages are attached on the surface of the object substrate P, and a wiring pattern is formed on each piece. In addition, there are areas (indicated by chain lines in the drawing) in which high-density wiring patterns are formed on the respective pieces Q1 to Q8. Hereinafter, in particular, the areas in which the high-density wiring patterns are formed are referred to as "minute pattern areas."

As the digital micromirror devices D1, D2, and D3 expose the object substrate P which moves relatively with respect to the digital micromirror devices D1, D2, and D3 in a positional relationship shown in FIG. 20, each micromirror positioned in the vicinity of the centers of the digital micromirror devices exposes areas R1, R2, and R3 on the object substrate P, and each micromirror positioned in the vicinity of the stitch portions of the digital micromirrors expose areas T1 and T2. When the micromirror positioned in the vicinity of the stitch portions of the digital micromirror devices, which causes the exposure irregularity, exposes the minute pattern area (indicated by the shaded area) (areas T1 and T2), the defective resolution occurs in the corresponding area.

In order to remove the exposure irregularity causing the defective resolution, it can be considered that the optical system in high accuracy is used or the mounting position of the patterning head is finely adjusted with high precision. However, it requires lots of time, labors and costs in the work of assembling or adjusting the direct patterning apparatus.

SUMMARY OF THE INVENTION

The present invention has been made in view of the above circumstances, and provides a patterning method and a computer readable medium therefor, in a direct patterning apparatus which forms a desired pattern on the surface of the object by exposing the surface of the object to light by using a plurality of spatial light modulation elements installed in a direction perpendicular to the relative moving direction of the object, thereby a defective resolution does not occur on the surface of the object.

In some implementations, a patterning method of the invention for forming a pattern on a surface of an object, the patterning method comprising:

determining an arrangement available range of the object as to a direction perpendicular to a relative moving direction of the object, so that the largest number of a plurality of predetermined areas which is on the surface of the object and is aligned in the direction perpendicular to the relative moving direction of the object is positioned in stable exposure areas each of which is located in a center part of respective exposure areas in the direction perpendicular to the relative moving direction of the object, the exposure areas being defined along the relative moving direction of the object; and setting a set position of the object as to the direction perpendicular to the relative moving direction in the determined arrangement available range, for exposing the predetermined areas positioned in the stable exposure areas to light by a plurality of spatial light modulation elements assigned to the exposure areas respectively.

That is, according to the aspect of the invention, the predetermined areas on the surface of the object that are to be positioned in the vicinity of the border of the exposure areas by the spatial light modulation elements are exposed to light by the spatial light modulation elements corresponding to the exposure areas, after the object is shifted in the direction perpendicular to the relative moving direction such that the predetermined areas are positioned in the vicinity of the center parts of the exposure areas.

The patterning method can be implemented by a computer program performed by an arithmetic processing unit such as a computer. The apparatus for performing the patterning method or the computer program for allowing the computer to perform the patterning method can be embodied by the person skilled in the art who can understand the following description. In addition, the fact that the computer program for allowing the computer to perform the patterning method may be stored on a storage device is known to the person skilled in the art.

In some implementations, a computer readable medium of the invention having a program including instructions for permitting a computer to execute a patterning process for forming a pattern on a surface of an object, the instructions comprising:

determining an arrangement available range of the object as to a direction perpendicular to a relative moving direction of the object, so that the largest number of a plurality of predetermined areas which is on the surface of the object and is aligned in the direction perpendicular to the relative moving direction of the object is positioned in stable exposure areas each of which is located in a center part of respective exposure areas in the direction perpendicular to the relative moving direction of the object, the exposure areas being defined along the relative moving direction of the object; and setting a set position of the object as to the direction perpendicular to the relative moving direction in the determined arrangement available range, for exposing the predetermined areas positioned in the stable exposure areas to light by a plurality of spatial light modulation elements assigned to the exposure areas respectively.

DESCRIPTION OF THE PREFERRED EMBODIMENTS

Figure 1:
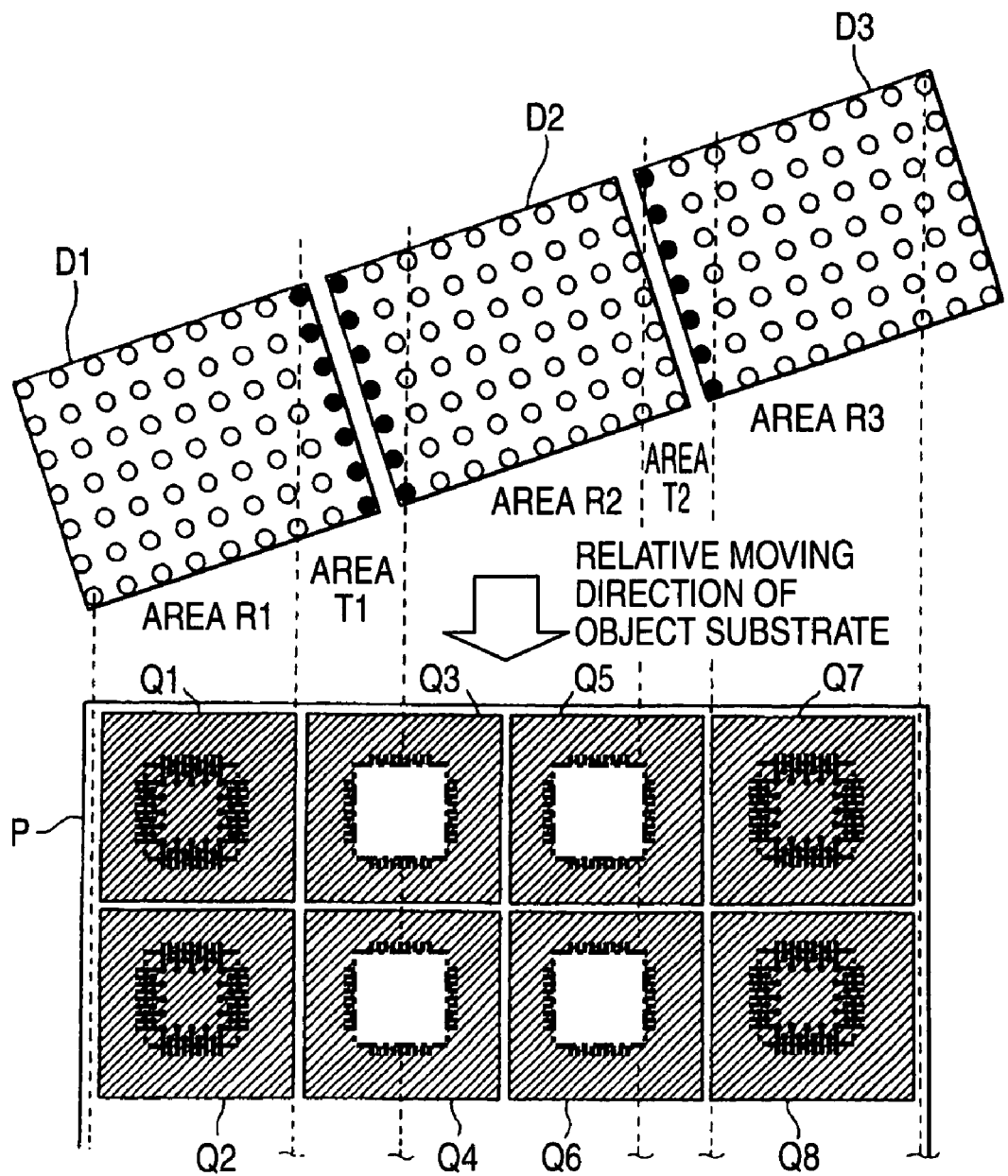
FIG. 1 is a first exemplary diagram illustrating an operation of a patterning method in a direct patterning apparatus according to an embodiment of the invention.
Figure 2:
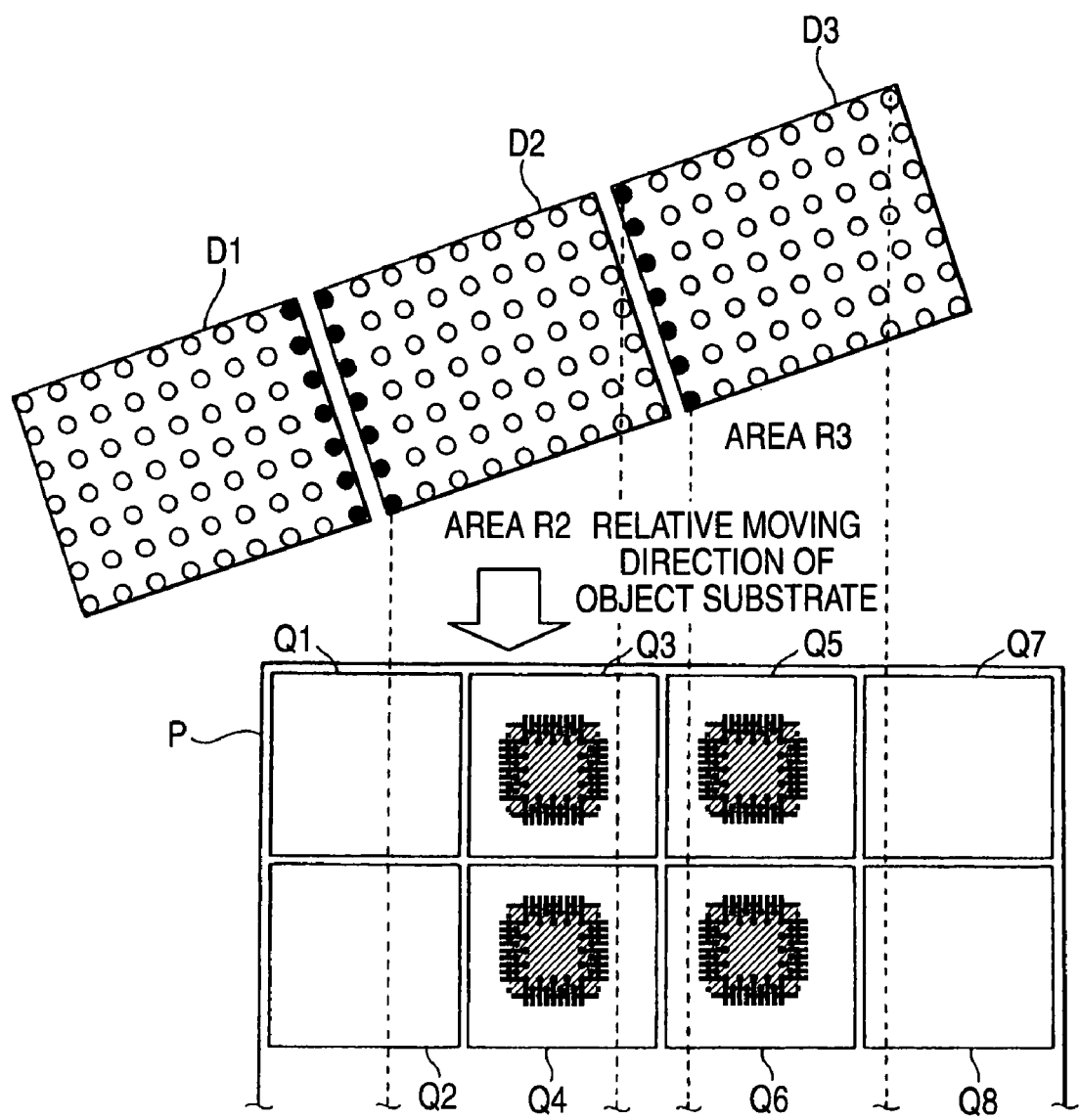
FIG. 2 is a second exemplary diagram illustrating the operation of the patterning method in the direct patterning apparatus according to the embodiment of the invention.

FIGS. 1 and 2 are diagrams showing an operation principle of a direct patterning apparatus according to an embodiment of the invention. In the embodiment, three digital micromirror devices D1, D2, and D3 are aligned in a direction nearly perpendicular to a relative moving direction (indicated by the thick arrow in the drawings) of an object substrate P. In the drawings, white circles and black circles represent micromirrors aligned two-dimensionally in the digital micromirror devices. In particular, the black circles represent the micromirrors existing in the vicinity of the stitch portions of the digital micromirror device D1, D2, and D3. In the embodiment, for example, pieces Q1 to Q8 to be the semiconductor packages are attached on the surface of the object substrate P, and a wiring pattern is formed on every piece. On each piece Q1 to Q8, a minute pattern area (indicated by chain lines in the drawings) exists in which a wiring pattern is formed in high density to the extent that exposure irregularity affects the resolution. In addition, the number of the digital micromirror devices and that of the pieces attached on the object substrate are not limited to the embodiment of the invention, but the other number thereof can be used.

The exposure areas by the digital micromirror devices D1, D2, and D3 are divided into two areas, that is, stable exposure areas R1, R2, and R3 positioned in the vicinity of the centers of the digital micromirror devices D1, D2, and D3; and areas T1 and T2 in which the exposure irregularity may occur by the micromirrors existing in the stitch portions of the digital micromirror devices D1, D2, and D3.

Each of the pieces Q1, Q3, Q5, and Q7 is aligned in a direction perpendicular to the relative moving direction on the surface of the object substrate P. A state in the largest number of the minute pattern areas in the pieces Q1, Q3, Q5, and Q7 exists in the stable exposure areas R1, R2, and R3 of the digital micromirror devices D1, D2, and D3 is shown in FIG. 1. As shown in the drawing, the minute pattern area in the piece Q1 is positioned in the stable exposure area R1 of the digital micromirror device D1, and the minute pattern area in the piece Q7 is positioned in the stable exposure area R3 of the digital micromirror device D3. The position of the object substrate P in the direction perpendicular to the relative moving direction is determined as a set position of the object in the direction perpendicular to the relative moving direction when the minute pattern areas in the pieces Q1 and Q7 positioned in the stable exposure areas R1 and R3 are exposed to light. In the embodiment, the pieces Q1 and Q7 are exposed to light by irradiating light by using the digital micromirror devices D1 and D3 with the positional relation shown in FIG. 1. Likewise, the pieces Q2 and Q8 positioned in the relative moving direction of the object substrate with respect to the pieces Q1 and Q7, respectively, are exposed to light by irradiating light by using the digital micromirror device D1 and D3 under the positional relation shown in FIG. 1.

Meanwhile, under the positional relation shown in FIG. 1, the minute pattern area in the piece Q3 is not positioned in any stable exposure area but positioned in the area T1 exposed to light by the micromirrors located in the stitch portions between the digital micromirror devices D1 and D2. Likewise, the minute pattern area in the piece Q5 is not positioned in any stable exposure area but positioned in the area T2 exposed to light by the micromirrors located in the stitch portions between the digital micromirror devices D2 and D3, under the positional relation shown in FIG. 1. When the minute pattern areas are exposed to light by the micromirrors located in the stitch portions which cause the exposure irregularity, defective resolution may occur. Consequently, in the embodiment, as for the minute pattern areas in the pieces Q3 and Q5, lights are not irradiated under the positional relation shown in FIG. 1, so that the minute pattern areas in the pieces Q3 and Q5 are not exposed to light.

Under the positional relation shown in FIG. 1, the object substrate P is shifted in the direction perpendicular to the relative moving direction, such that the minute pattern areas in the pieces Q3 and Q5 positioned in the vicinity of the stitch portions between the digital micromirror devices are positioned in the stable exposure areas of the digital micromirror devices as shown in FIG. 2. That is, the object substrate P is shifted so that the minute pattern area in the piece Q3 is positioned in the stable exposure area R2 of the digital micromirror device D2, and the minute pattern area in the piece Q5 is positioned in the stable exposure area R3 of the digital micromirror device D3. The position of the object substrate P in the direction perpendicular to the relative moving direction is determined as the set position of the object in the direction perpendicular to the relative moving direction when the minute pattern areas in the pieces Q3 and Q5 positioned in the stable exposure areas R2 and R3 are exposed to light. That is, the minute pattern areas in the pieces Q3 and Q5 are exposed to light by irradiating light by using the digital micromirror devices D2 and D3 under the positional relation shown in FIG. 2. Likewise, the pieces Q4 and Q6 positioned in the relative moving direction of the object substrate with respect to the pieces Q3 and Q7, respectively, are exposed to light by irradiating light by using the digital micromirror devices D2 and D3 under the positional relation shown in FIG. 2.

Figure 3:
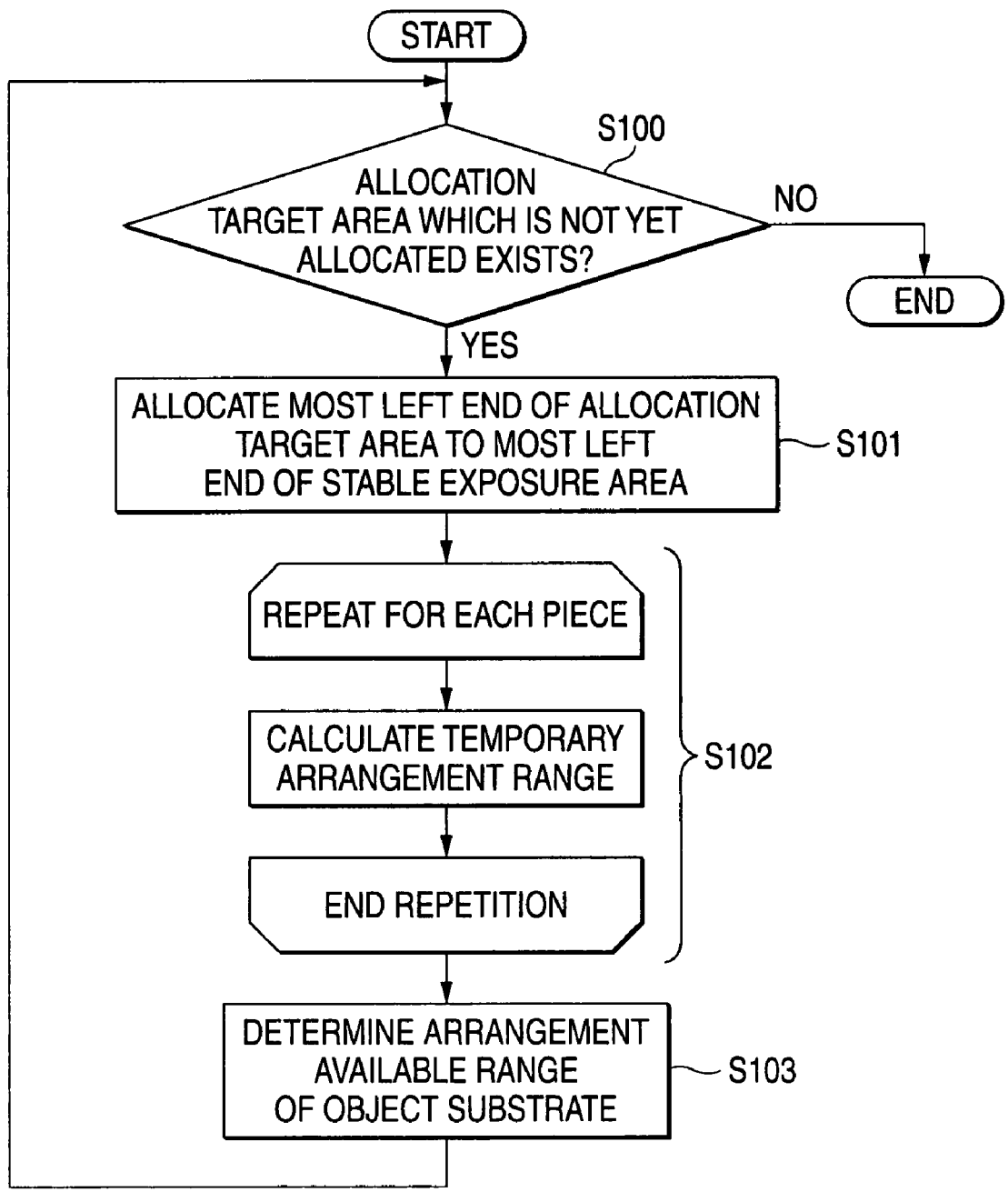
FIG. 3 is a flowchart illustrating an operation of the patterning method in the direct patterning apparatus according to the embodiment of the invention.

FIG. 3 is a flowchart illustrating an operation of determining the set position of the object substrate according to the embodiment of the invention. In addition, FIGS. 4 to 16B are diagrams illustrating one specific example for determining the set position of the object substrate.

Figure 4:
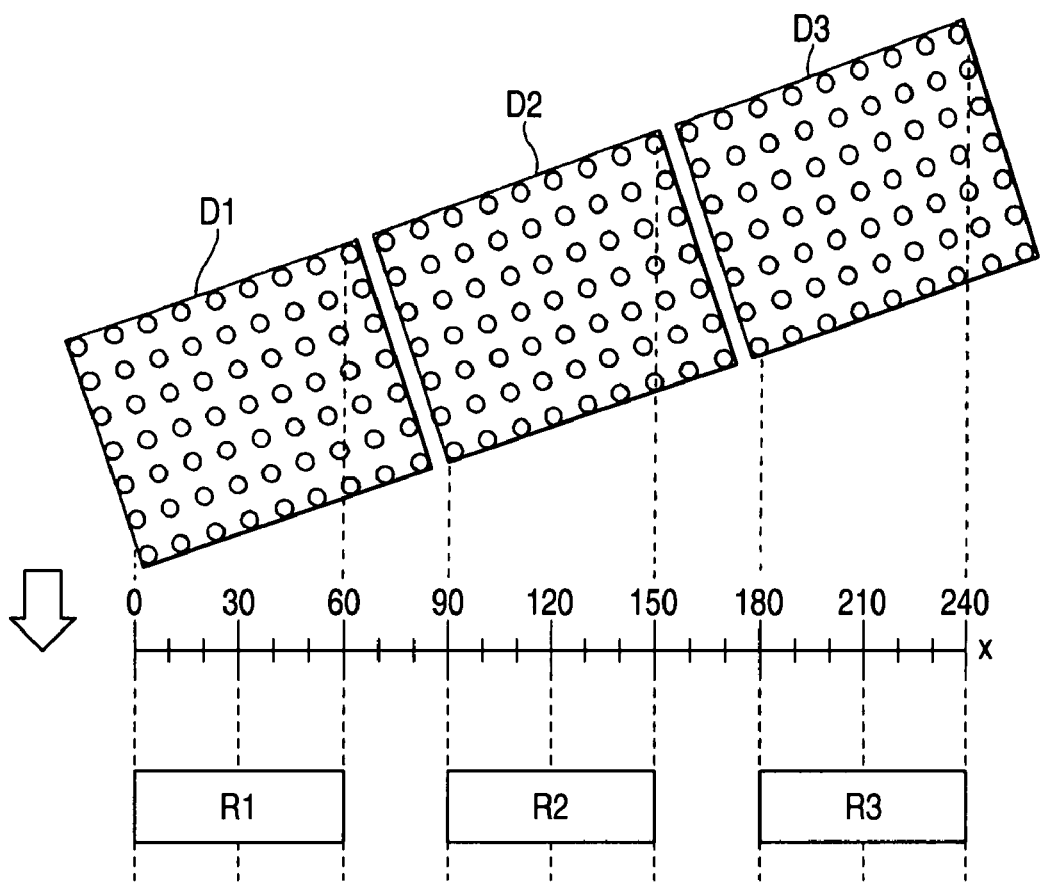
FIG. 4 is a first exemplary diagram illustrating a specific example in which a set position of an object substrate is determined according to the embodiment of the invention.
Figure 5:
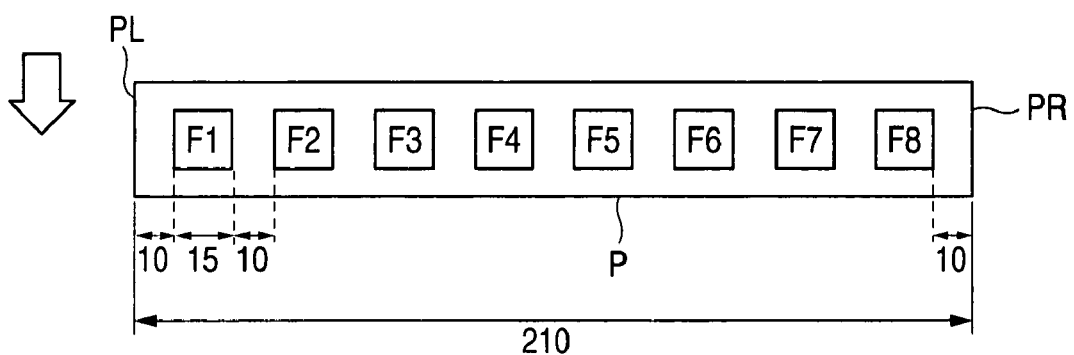
FIG. 5 is a second exemplary diagram illustrating the specific example in which the set position of the object substrate is determined according to the embodiment of the invention.

In the specific example, it will be described with a reference to a case where the object substrate P shown in FIG. 5 is exposed to light by using the three digital micromirror devices D1, D2, and D3 shown in FIG. 4.

In FIG. 4, the thick arrow indicates the relative moving direction of the digital micromirror devices D1, D2, and D3, and the white circles indicate the micromirrors aligned two-dimensionally in the digital micromirror devices D1, D2, and D3. In the embodiment, in order to make a clear description, a coordinate axis shown in the drawing is set in the direction perpendicular to the relative moving direction. In the specific example, a width in the direction perpendicular to the relative moving direction, of each of the stable exposure areas R1, R2, and R3 in the vicinity of the centers of the digital micromirror devices D1, D2, and D3 is set as "60." In addition, the distance between the stable exposure areas R1 and R2 and that between the stable exposure areas R2 and R3 are set as "30." That is, along the direction perpendicular to the relative moving direction, the stable exposure area R1 in the vicinity of the center of the digital micromirror device D1 is positioned in the range of "0 to 60", the stable exposure area R2 in the vicinity of the center of the digital micromirror device D2 is positioned in the range of "90 to 150", and the stable exposure area R3 in the vicinity of the center of the digital micromirror device D3 is positioned in the range of "180 to 240."

In the embodiment, areas F1 to F8 (referred to as "allocation target areas") that should not be exposed to light by the micromirrors located in the stitch portions between the digital micromirror devices are aligned at the regular interval along the direction perpendicular to the relative moving direction on the object substrate P as shown in FIG. 5. In the specific example, the allocation target areas F1 to F8 are the minute pattern areas described above. In the specific example, the wiring pattern is also formed on the surface of the object substrate P other than the allocation target areas F1 to F8. However, it is assumed that those wiring patterns are exposed to light without causing the defective resolution even when the micromirrors positioned in the stitch portions between the digital micromirror devices are used for exposure.

In the specific example, a width of the object substrate P in the direction perpendicular to the relative moving direction is set as "210." The most left end of the object substrate P is referred to as PL, and the most right end thereof is referred to as PR for convenience. The position of the object substrate P is indicated as "the coordinate of the most left end PL of the object substrate P" as long as not mentioned. A width of each of the allocation target areas F1 to F8 in the direction perpendicular to the relative moving direction is set as "15", and the distance of the regular interval between the allocation target areas F1 to F8 is set as "10." A distance between the most left end PL of the object substrate P and the left side of the allocation target area F1 is "10", and a distance between the most right end PR of the object substrate P and the right side of the allocation target area F8 is also "10."

In the first place, in the step S100 shown in FIG. 3, it is determined whether the allocation target areas which are not yet allocated exist or not, which is described below.

Figure 6A:
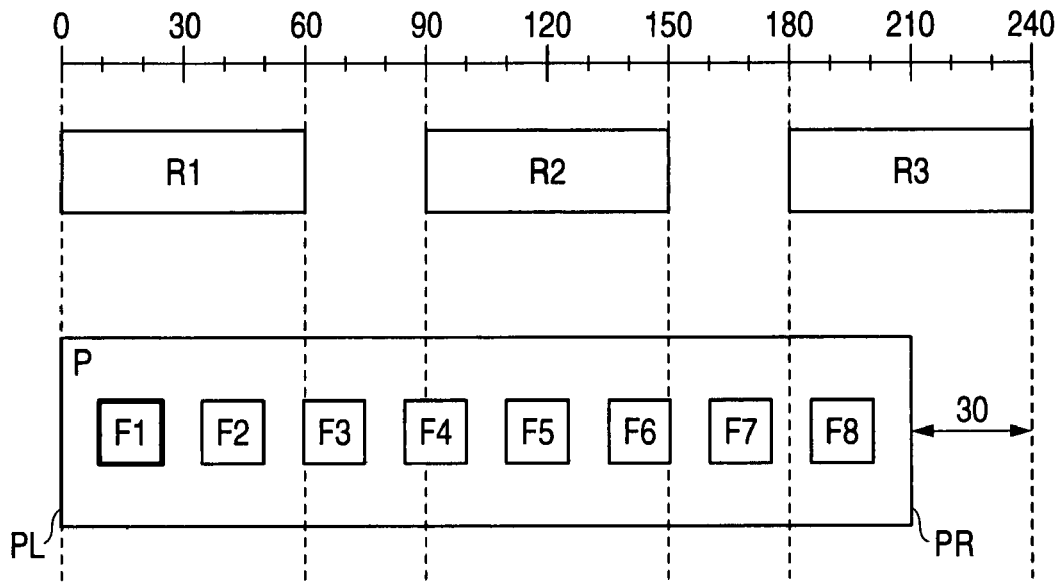
FIGS. 6A and 6B are third exemplary diagrams illustrating the specific example in which the set position of the object substrate is determined according to the embodiment of the invention.

In the step S101 shown in FIG. 3, the allocation target area positioned in the most left end among the allocation target areas arranged in the direction perpendicular to the relative moving direction on the surface of the object substrate P is allocated to the most left stable exposure area. That is, as shown in FIG. 6A, among the allocation target areas F1 to F8 arranged in the direction perpendicular to the relative moving direction on the surface of the object substrate P, the allocation target area F1 positioned in the most left end of the object substrate P is allocated to the stable exposure area R1 positioned in the most left end. Afterward, a process (that is, the process of the step S102 in FIG. 3) of calculating a temporary arrangement range of the object area P in which the allocation target areas F1 to F8 can be positioned in the stable exposure areas is performed in order from one side in the direction perpendicular to the relative moving direction of the object substrate P, that is, in order of the allocation target areas F1, F2, F3, F4, F5, F6, F7, and F8 in the embodiment as described below. In addition, the present invention is not limited to the order of the calculation process in this embodiment, but the process can be performed in the converse order of the embodiment, that is, F8, F7, F6, F5, F4, F3, F2, and F1. In this case, in the step S101 of FIG. 3, the process can be performed after the allocation target area F8 positioned in the most right end of the object substrate P among the allocation target areas F1 to F8 arranged in the direction perpendicular to the relative moving direction on the surface of the object substrate P is allocated to the stable exposure area R3.

Figure 6B:
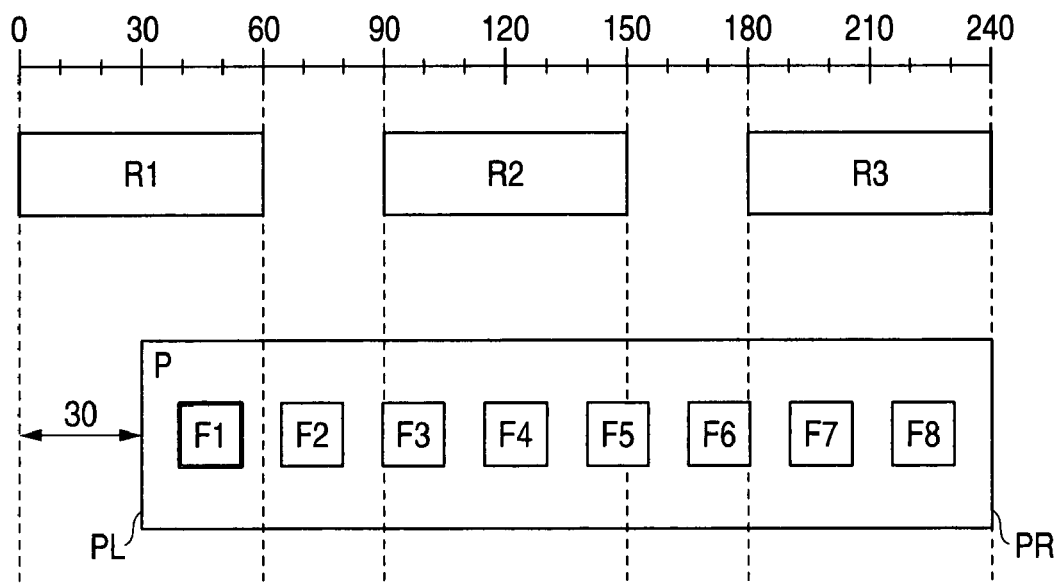

In the first place, as described with reference to FIGS. 6A and 6B for the reference, the temporary arrangement range of the object substrate P in the direction perpendicular to the relative moving direction is calculated, in which the allocation target area F1 can be positioned in the stable exposure area. When the object substrate P is positioned between a position in which the most left end PL is positioned in the most left end of the stable exposure area R1 as shown in FIG. 6A (i.e., the coordinate of the most left end PL of the object substrate P is "0") and a position in which the most right end PR is positioned in the most right end of the stable exposure area R3 as shown in FIG. 6B (i.e., the coordinate of the most left end PL of the object substrate P is "30"), the allocation target area F1 is positioned in the stable exposure area R1, and the vicinity of the most left end PL and that of the most right end PR of the object substrate P can be positioned in the stable exposure areas R1 and R3, respectively. As a result, the temporary arrangement range of the object substrate P satisfying the condition that the allocation target area F1 can be positioned in the stable exposure area R1 is "0 to 30."

Figure 7A:
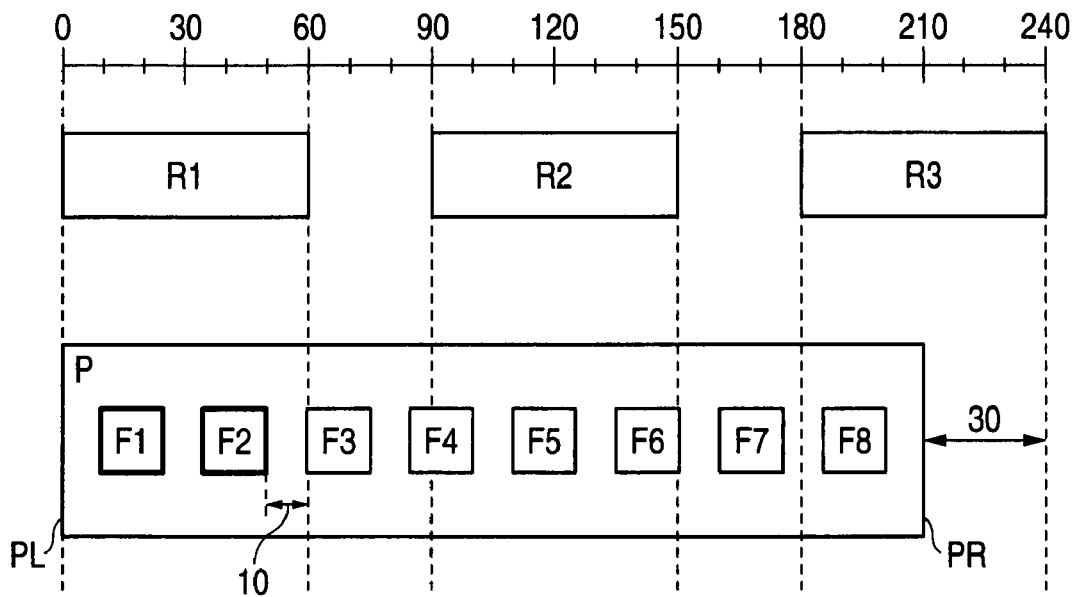
FIGS. 7A and 7B are fourth exemplary diagrams illustrating the specific example in which the set position of the object substrate is determined according to the embodiment of the invention.
Figure 7B:
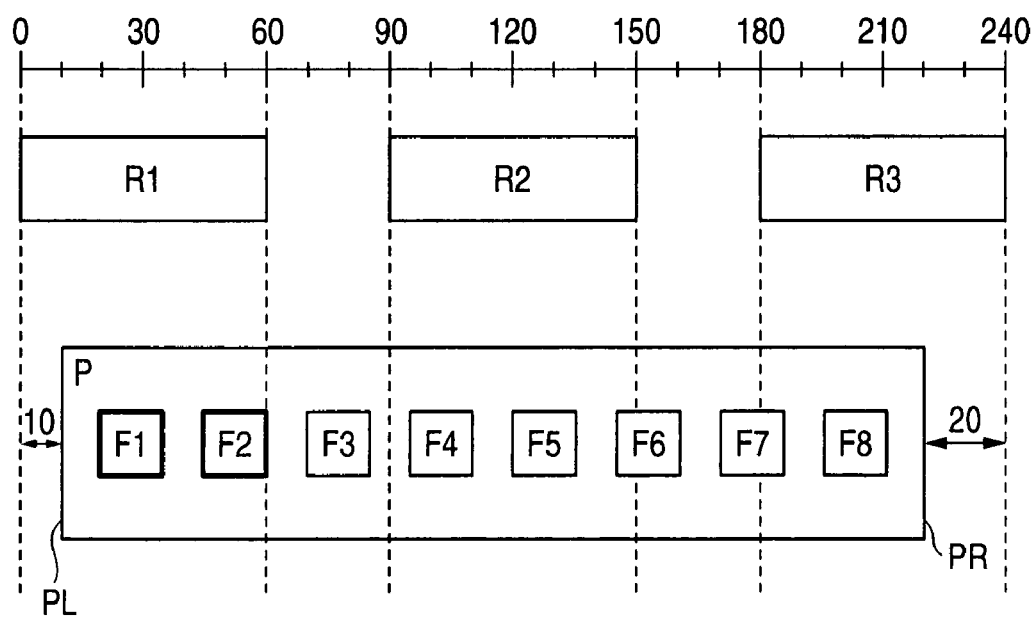

Sequentially, as shown in FIGS. 7A and 7B for reference, the temporary arrangement range of the object substrate P in the direction perpendicular to the relative moving direction is calculated, such that the allocation target area F2 adjacent to the allocation target area F1 in the direction perpendicular to the relative moving direction can be positioned in the stable exposure area. The temporary arrangement range of the object substrate P in which the allocation target area F2 can be positioned in the stable exposure area needs to satisfy the condition that the allocation target area F1 described in FIGS. 6A and 6B is positioned in the stable exposure area R1. Consequently, the temporary arrangement range is calculated in the range of "0 to 30" which has been already calculated as the temporary arrangement range of the object substrate P above. That is, when the object substrate P is positioned between a position in which the most left end PL is positioned in the left side of the stable exposure area R1 as shown in FIG. 7A (i.e., the coordinate of the most left end PL of the object substrate P is "0") and a position in which the most right end of the allocation target area F2 is positioned in the most right side of the stable exposure area R1 as shown in FIG. 7B (i.e., the coordinate of the most left end PL of the object substrate P is "10"), the allocation target area F2 is positioned in the stable exposure area R1, and the allocation target area F1 can be positioned in the stable exposure area R1. In addition, as described already with reference to FIGS. 6A and 6B, the vicinity of the most left end PL and that of the most right end PR of the object substrate P can be positioned in the stable exposure areas R1 and R3 respectively, on the condition that the temporary arrangement range of the object substrate P is "0 to 30." Consequently, even when the temporary arrangement range of the object substrate P is "0 to 10", the vicinity of the most left end PL and that of the most right end PR of the object substrate P can be also positioned in the stable exposure areas R1 and R3, respectively. As a result, the temporary arrangement range of the object substrate P satisfying the condition that the allocation target area F2 can be positioned in the stable exposure area R1 is "0 to 10."

Figure 8A:
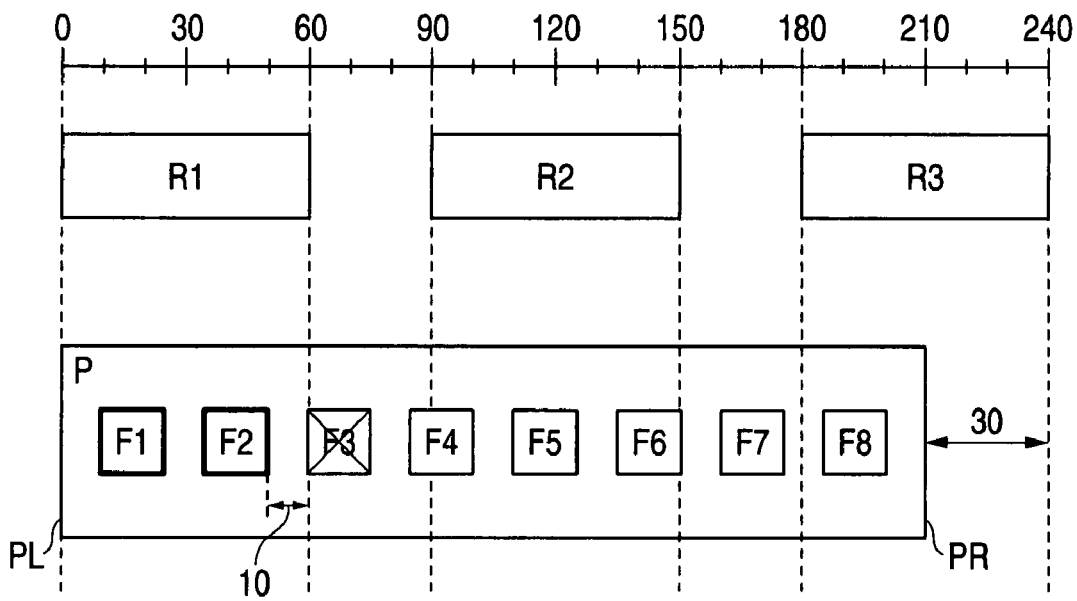
FIGS. 8A and 8B are fifth exemplary diagrams illustrating the specific example in which the set position of the object substrate is determined according to the embodiment of the invention.
Figure 8B:
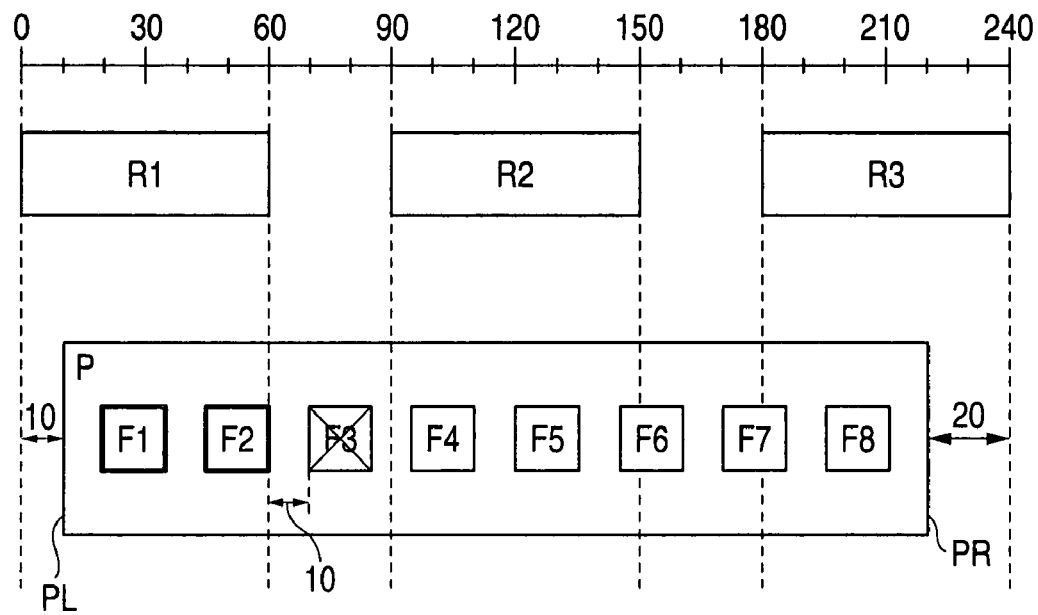

Sequentially, as shown in FIGS. 8A and 8B for reference, the temporary arrangement range of the object substrate P in the direction perpendicular to the relative moving direction is calculated, such that the allocation target area F3 adjacent to the allocation target area F2 in the direction perpendicular to the relative moving direction can be positioned in the stable exposure area. The temporary arrangement range of the object substrate P in which the allocation target area F3 can be positioned in the stable exposure area needs to satisfy the condition that the allocation target areas F1 and F2 are positioned in the stable exposure area R1 as described in FIGS. 6A, 6B, 7A, and 7B. Consequently, the temporary arrangement range is calculated in the range of "0 to 10" which has been already calculated as the temporary arrangement range of the object substrate P in the above. In this case, even when the object substrate P is temporarily set in the range of "0 to 10" which is the temporary arrangement range, the coordinate of the most left end of the allocation target area F3 is positioned just in the range of "60 to 70," and cannot be positioned in any stable exposure area as shown in FIGS. 8A and 8B. Consequently, the temporary arrangement range of the object substrate P in which the allocation target area F3 can be positioned in the stable exposure area is not calculated in this step, and the allocation target area F3 is not also allocated to any stable exposure area.

Figure 9A:
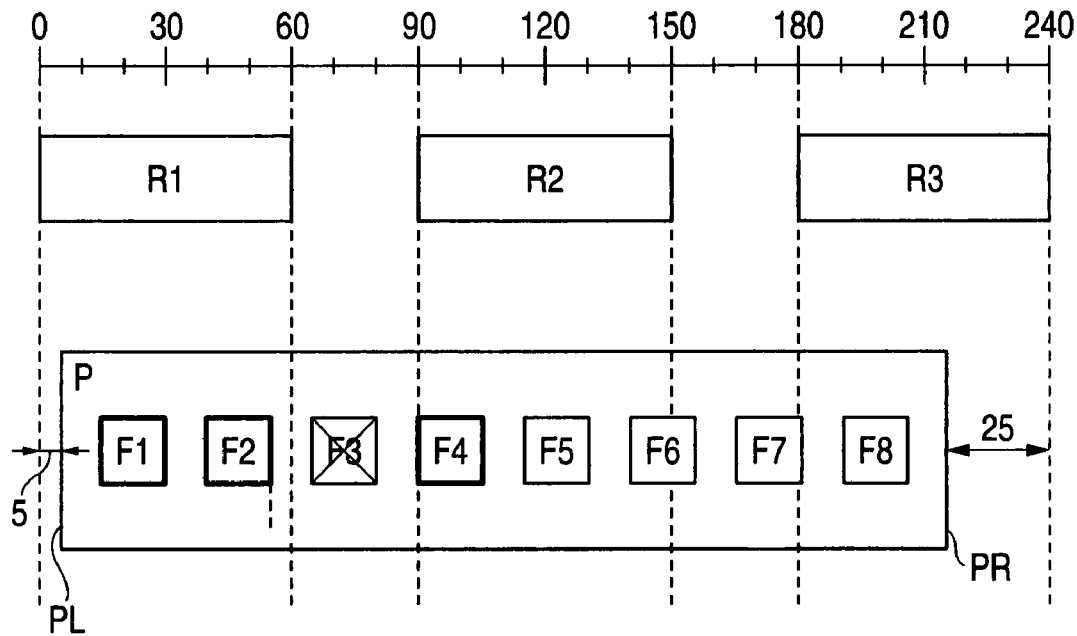
FIGS. 9A and 9B are sixth exemplary diagrams illustrating the specific example in which the set position of the object substrate is determined according to the embodiment of the invention.
Figure 9B:
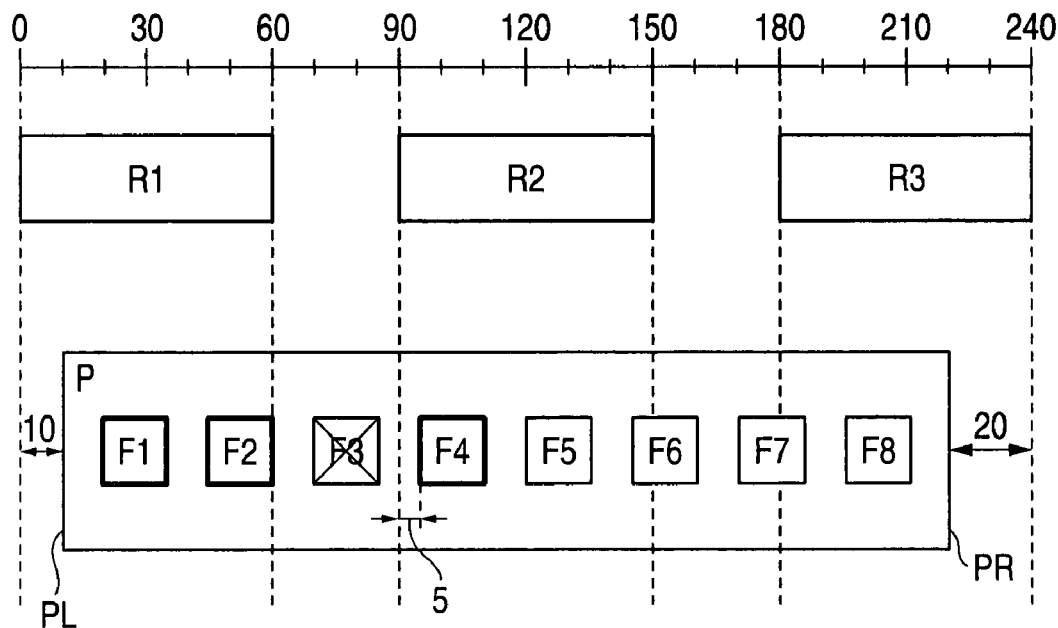

Next, as shown in FIGS. 9A and 9B for reference, the temporary arrangement range of the object substrate P in the direction perpendicular to the relative moving direction is calculated, such that the allocation target area F4 adjacent to the allocation target area F3 in the direction perpendicular to the relative moving direction can be positioned in the stable exposure area. The temporary arrangement range of the object substrate P in which the allocation target area F4 can be positioned in the stable exposure area needs to satisfy the condition that the allocation target areas F1 and F2 are positioned in the stable exposure area R1 as described in FIGS. 6A, 6B, 7A, and 7B. Consequently, the temporary arrangement range is calculated in the range of "0 to 10" which has been already calculated as the temporary arrangement range of the object substrate P. Moreover, as described with reference to FIGS. 8A and 8B, the allocation target area F3 cannot be positioned in any stable exposure area. Consequently, when the temporary arrangement range of the object substrate P in which the allocation target area F4 can be positioned in the stable exposure area is calculated, the allocation target area F3 is excluded from calculation. That is, when the object substrate P is positioned between a position in which the most left side of the allocation target area F4 is positioned in the most left side of the stable exposure area R2 as shown in FIG. 9A (i.e., the coordinate of the most left end PL of the object substrate P is "5") and a position in which the most right side of the allocation target area F2 is positioned in the most right side of the stable exposure area R1 as shown in FIG. 9B (i.e., the coordinate of the most left end PL of the object substrate P is "10"), the allocation target area F4 is positioned in the stable exposure area R2, and the allocation target areas F1 and F2 can be positioned in the stable exposure area R1. In addition, as described already with reference to FIGS. 6A and 6B, the vicinity of the most left end PL and that of the most right end PR of the object substrate P can be positioned in the stable exposure areas R1 and R3 respectively, on the condition that the temporary arrangement range of the object substrate P is in the range of "0 to 30." Consequently, even when the temporary arrangement range of the object substrate P is "5 to 10", the vicinity of the most left end PL and that of the most right end PR of the object substrate P can be also positioned in the stable exposure areas R1 and R3, respectively. As a result, the temporary arrangement range of the object substrate P satisfying the condition that the allocation target area F4 can be positioned in the stable exposure area R2 is "5 to 10."

Figure 10A:
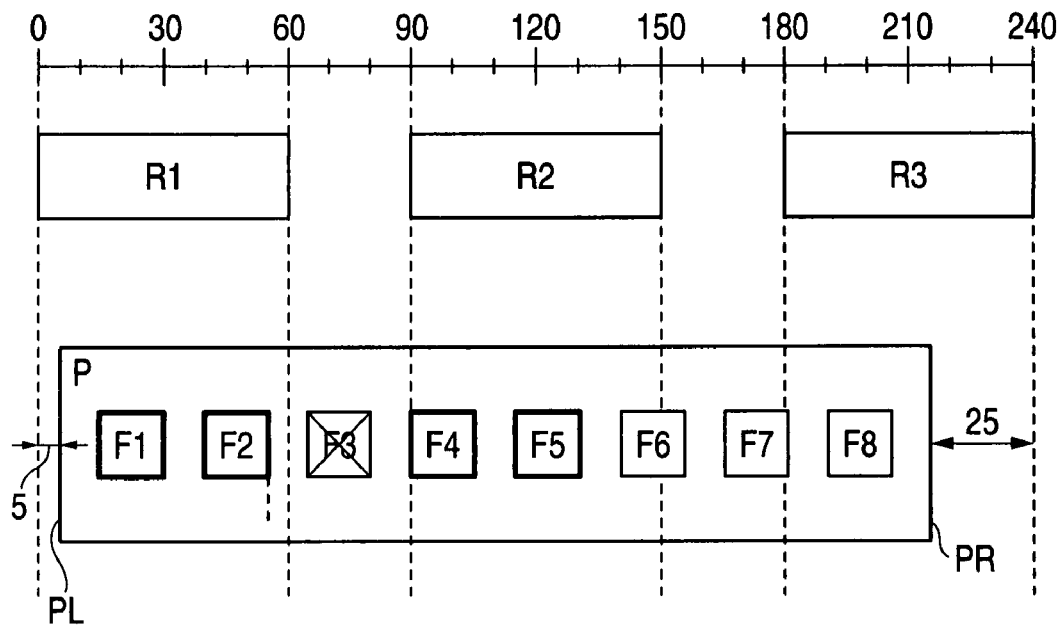
FIGS. 10A and 10B are seventh exemplary diagrams illustrating the specific example in which the set position of the object substrate is determined according to the embodiment of the invention.
Figure 10B:
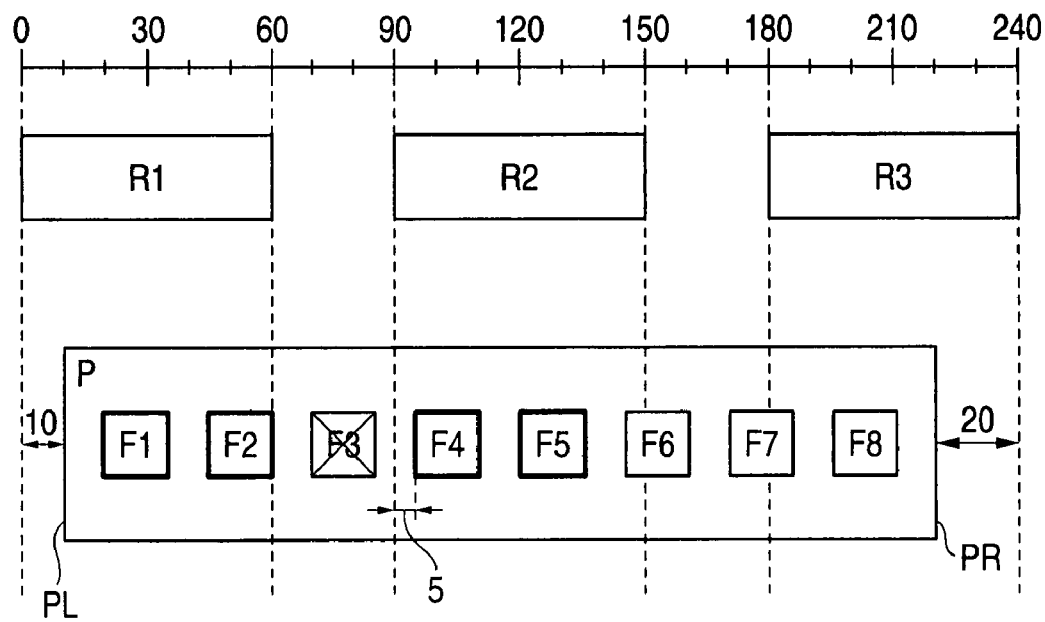

Sequentially, as shown in FIGS. 10A and 10B for reference, the temporary arrangement range of the object substrate P in the direction perpendicular to the relative moving direction is calculated, such that the allocation target area F5 adjacent to the allocation target area F4 in the direction perpendicular to the relative moving direction can be positioned in the stable exposure area. The temporary arrangement range of the object substrate P in which the allocation target area F5 can be positioned in the stable exposure area needs to satisfy the condition that the allocation target areas F1 and F2 are positioned in the stable exposure area R1 and the allocation target area F4 is also positioned in the stable exposure area R2 as described in FIGS. 6A, 6B, 7A, 7B, 9A, and 9B for reference. Consequently, the temporary arrangement range is calculated in the range of "5 to 10" which has been already calculated as the temporary arrangement range of the object substrate P. Moreover, as described with reference to FIGS. 8A and 8B, the allocation target area F3 cannot be positioned in any stable exposure area. Consequently, when the temporary arrangement range of the object substrate P in which the allocation target area F5 can be positioned in the stable exposure area is calculated, the allocation target area F3 is excluded from calculation. That is, when the object substrate P is positioned between a position in which the most left side of the allocation target area F4 is positioned in the most left side of the stable exposure area R2 as shown in FIG. 10A (i.e., the coordinate of the most left end PL of the object substrate P is "5") and a position in which the most right side of the allocation target area F2 is positioned in the most right side of the stable exposure area R1 as shown in FIG. 10B (i.e., the coordinate of the most left end PL of the object substrate P is "10"), the allocation target area F5 can be positioned in the stable target area R2, the allocation target area F4 can be positioned in the stable exposure area R2, and the allocation target areas F1 and F2 can be positioned in the stable exposure area R1. In addition, as described already with reference to FIGS. 6A and 6B, the vicinity of the most left end PL and that of the most right end PR of the object substrate P can be positioned in the stable exposure areas R1 and R3 respectively, on the condition that the temporary arrangement range of the object substrate P is in the range of "0 to 30." Consequently, even when the temporary arrangement range of the object substrate P is "5 to 10", the vicinity of the most left end PL and that of the most right end PR of the object substrate P can be also positioned in the stable exposure areas R1 and R3, respectively. As a result, the temporary arrangement range of the object substrate P satisfying the condition that the allocation target area F5 can be positioned in the stable exposure area R2 is "5 to 10."

Figure 11A:
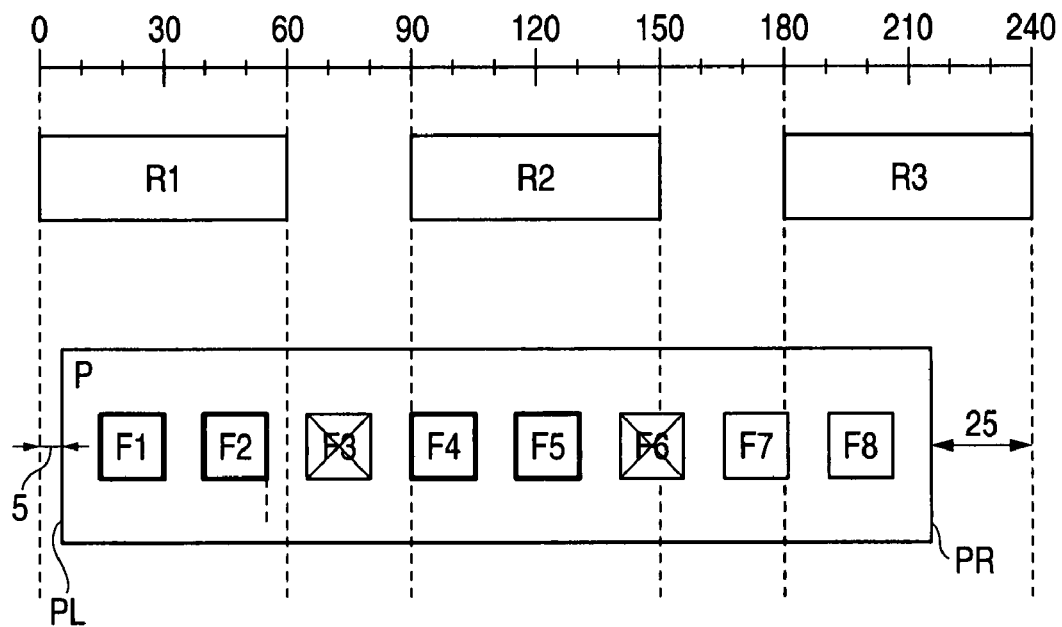
FIGS. 11A and 11B are eighth exemplary diagrams illustrating the specific example in which the set position of the object substrate is determined according to the embodiment of the invention.
Figure 11B:
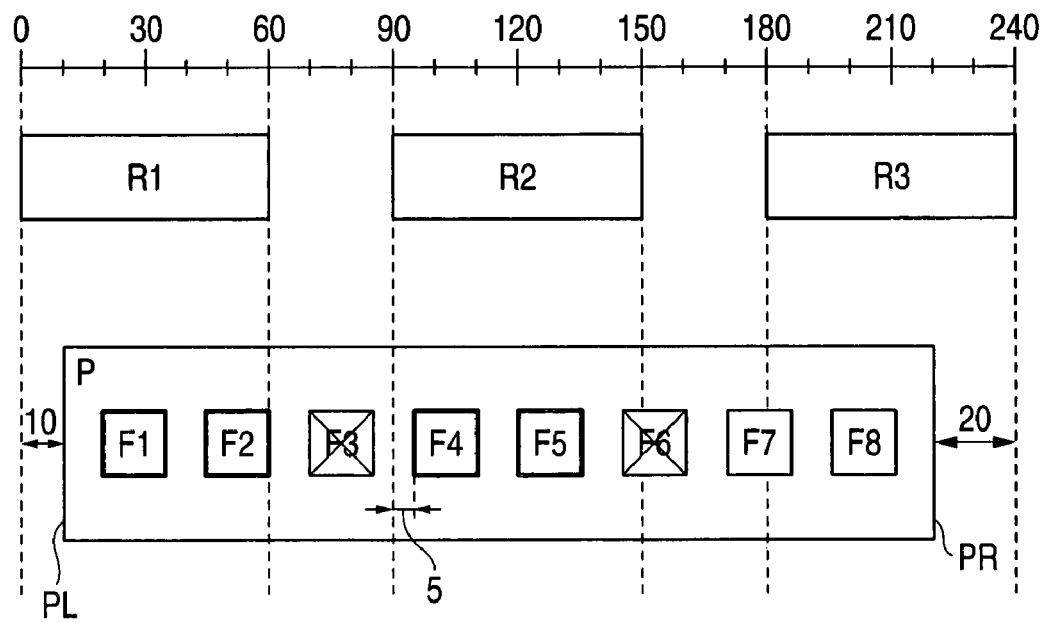

Sequentially, as shown in FIGS. 11A and 11B for reference, the temporary arrangement range of the object substrate P in the direction perpendicular to the relative moving direction is calculated, such that the allocation target area F6 adjacent to the allocation target area F5 in the direction perpendicular to the relative moving direction can be positioned in the stable exposure area. The temporary arrangement range of the object substrate P in which the allocation target area F6 can be positioned in the stable exposure area needs to satisfy the condition that the allocation target areas F1 and F2 are positioned in the stable exposure area R1 and the allocation target areas F4 and F5 are also positioned in the stable exposure area R2 as described in FIGS. 6A, 6B, 7A, 7B, 9A, 9B, 10A and 10B for reference. Consequently, the temporary arrangement range is calculated in the range of "5 to 10" which has been already calculated as the temporary arrangement range of the object substrate P. Moreover, as described with reference to FIGS. 8A and 8B, the allocation target area F3 cannot be positioned in any stable exposure area. Consequently, when the temporary arrangement range of the object substrate P in which the allocation target area F6 can be positioned in the stable exposure area is calculated, the allocation target area F3 is excluded from calculation. In this case, even when the object substrate P is temporarily set in the temporary arrangement range of "5 to 10," only the coordinate of the most left end of the allocation target area F6 is positioned in the range of "140 to 145," and the allocation target area F6 cannot be positioned in any stable exposure area as shown in FIGS. 11A and 11B. Consequently, the temporary arrangement range of the object substrate P in which the allocation target area F6 can be positioned in the stable exposure area is not calculated in this step, and the allocation target area F6 is not also allocated to any stable exposure area.

Figure 12A:
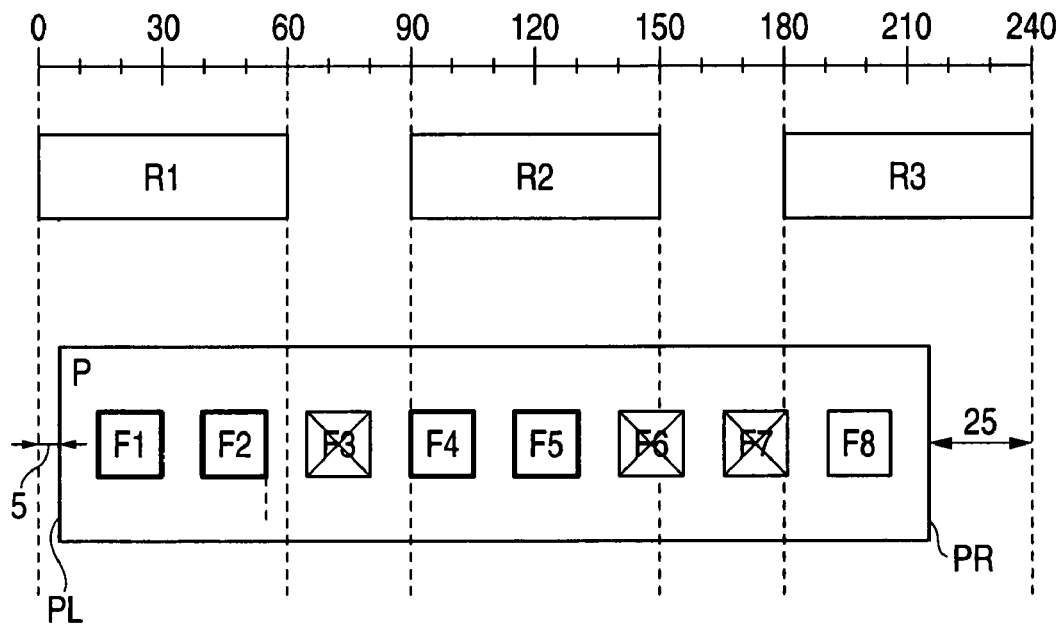
FIGS. 12A and 12B are ninth exemplary diagrams illustrating the specific example in which the set position of the object substrate is determined according to the embodiment of the invention.
Figure 12B:
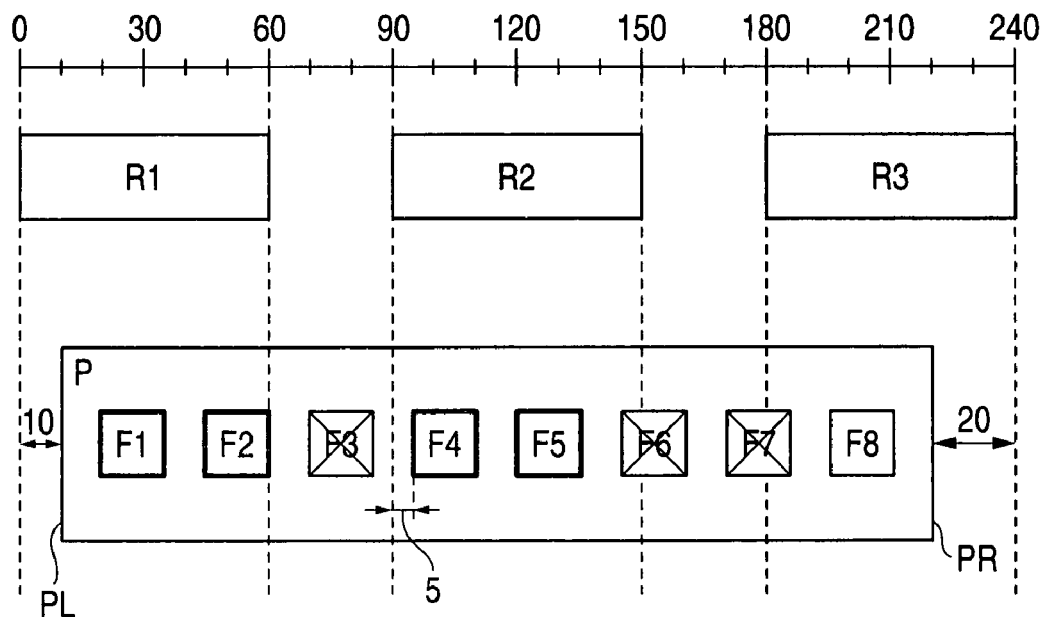

Sequentially, as shown in FIGS. 12A and 12B for reference, the temporary arrangement range of the object substrate P in the direction perpendicular to the relative moving direction is calculated, such that the allocation target area F7 adjacent to the allocation target area F6 in the direction perpendicular to the relative moving direction can be positioned in the stable exposure area. The temporary arrangement range of the object substrate P in which the allocation target area F6 can be positioned in the stable exposure area needs to satisfy the condition that the allocation target areas F1 and F2 are positioned in the stable exposure area R1 and the allocation target areas F4 and F5 are also positioned in the stable exposure area R2 as described in FIGS. 6A, 6B, 7A, 7B, 9A, 9B, 10A, and 10B for reference. Consequently, the temporary arrangement range is calculated in the range of "5 to 10" which has been already calculated as the temporary arrangement range of the object substrate P. Moreover, as described with reference to FIGS. 8A, 8B, 11A, and 11B, the allocation target areas F3 and F6 cannot be positioned in any stable exposure area. Consequently, when the temporary arrangement range of the object substrate P in which the allocation target area F7 can be positioned in the stable exposure area is calculated, the allocation target areas F3 and F6 are excluded from the calculation. In this case, even when the object substrate P is temporarily set in the temporary arrangement range of "5 to 10," only the coordinate of the most left end of the allocation target area F7 is positioned in the range of "165 to 170," and the allocation target area F7 is not positioned in any stable exposure area as shown in FIGS. 12A and 12B. Consequently, the temporary arrangement range of the object substrate P in which the allocation target area F7 can be positioned in the stable exposure area is not calculated in this step, and the allocation target area F7 is not also allocated to any stable exposure area.

Figure 13A:
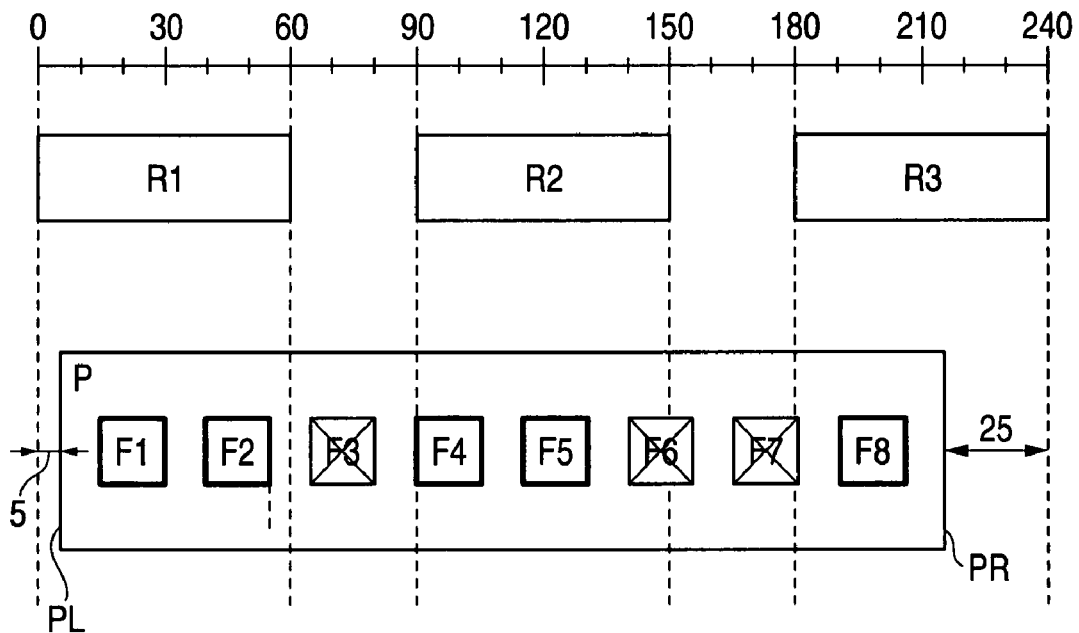
FIGS. 13A and 13B are tenth exemplary diagrams illustrating the specific example in which the set position of the object substrate is determined according to the embodiment of the invention.
Figure 13B:
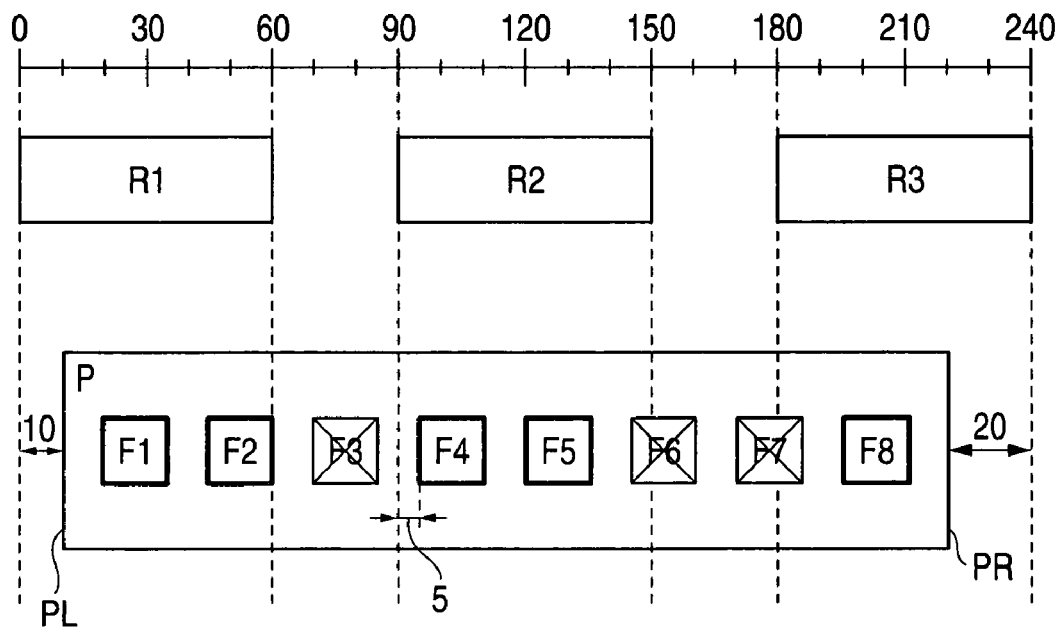

Next, as shown in FIGS. 13A and 13B for reference, the temporary arrangement range of the object substrate P in the direction perpendicular to the relative moving direction is calculated, such that the allocation target area F8 adjacent to the allocation target area F7 in the direction perpendicular to the relative moving direction can be positioned in the stable exposure area. The temporary arrangement range of the object substrate P in which the allocation target area F8 can be positioned in the stable exposure area needs to satisfy the condition that the allocation target areas F1 and F2 are positioned in the stable exposure area R1 and the allocation target areas F4 and F5 are positioned in the stable exposure area R2 as described in FIGS. 6A, 6B, 7A, 7B, 9A, 9B, 10A, and 10B. Consequently, the temporary arrangement range is calculated in the range of "5 to 10" which has been already calculated as the temporary arrangement range of the object substrate P. Moreover, as described with reference to FIGS. 8A, 8B, 11A, 11B, 12A, and 12B, the allocation target areas F3, F6, and F7 cannot be positioned in any stable exposure area. Consequently, when the temporary arrangement range of the object substrate P in which the allocation target area F8 can be positioned in the stable exposure area is calculated, the allocation target areas F3, F6, and F7 are excluded from the calculation. In this case, when the object substrate P is in the range of "5 to 10" which is the calculated temporary arrangement range of the object substrate P, as shown in FIGS. 13A and 13B, the allocation target area F8 can be positioned in the stable exposure area R3. In addition, the allocation target areas F4 and F5 can be positioned in the stable exposure area R2, and the allocation target areas F1 and F2 can be positioned in the stable exposure area R1. As a result, the temporary arrangement range of the object substrate P satisfying the condition that the allocation target area F8 can be positioned in the stable exposure area R3 is "5 to 10."

As described above, the calculation process in the step S102 in FIG. 3 is completed with respect to the allocation target areas F1, F2, F3, F4, F5, F6, F7, and F8. As a result, since the final temporary arrangement range of the object substrate P is calculated as "5 to 10," in the step S103 in FIG. 3, the range of "5 to 10" is determined as the arrangement available range in the direction perpendicular to the relative moving direction of the object substrate P. When the object substrate P is installed in the arrangement available range of "5 to 10," the allocation target areas F1 and F2 are positioned in the stable exposure area R1, the allocation target areas F4 and F5 are positioned in the stable exposure area R2, and the allocation target area F8 is positioned in the stable exposure area R3. Consequently, when the object substrate P is installed in the arrangement available range of "5 to 10," the allocation target areas F1, F2, F4, F5, and F8 positioned in the stable exposure areas are exposed to light. Conversely, since the allocation target areas F3, F6, and F7, which are not yet allocated, are not positioned in any stable exposure area, the exposure process is not performed in this step.

Figure 14A:
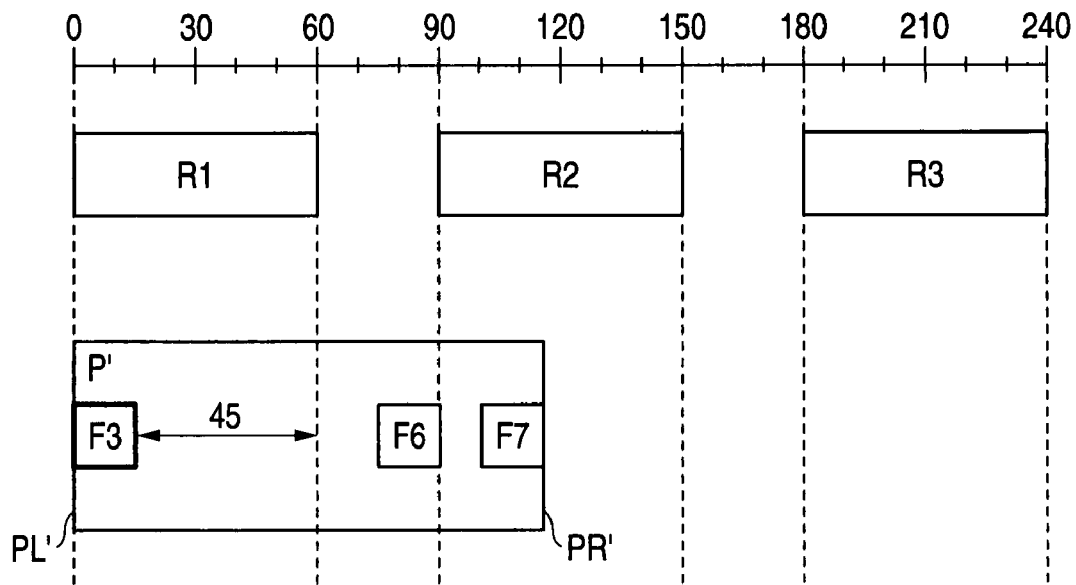
FIGS. 14A and 14B are eleventh exemplary diagrams illustrating the specific example in which the set position of the object substrate is determined according to the embodiment of the invention.
Figure 14B:
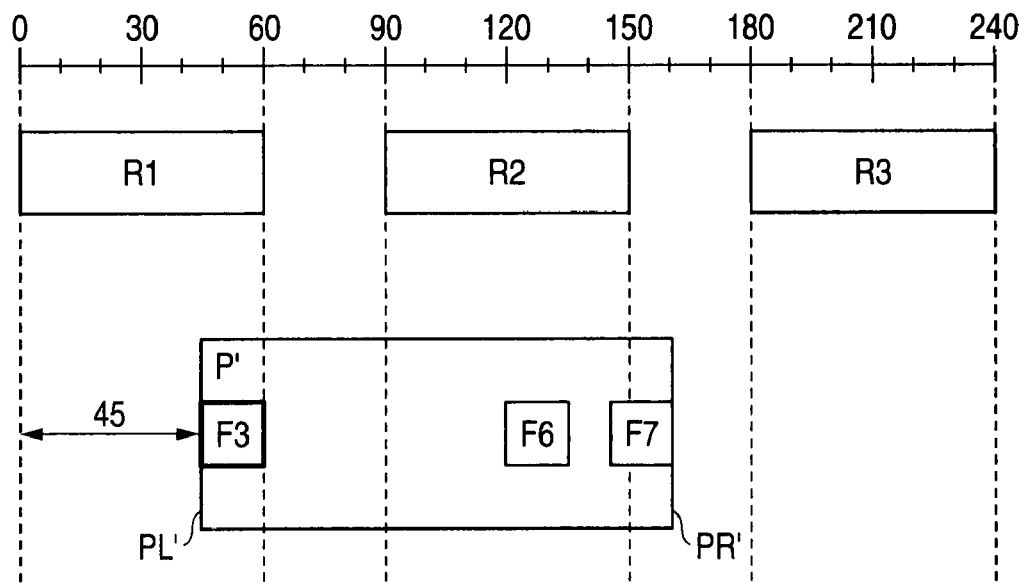

As for the allocation target areas F3, F6, and F7 which are not yet allocated, the calculation process in the step S102 in FIG. 3 is performed again after the exposure target substrate P is shifted in the direction perpendicular to the relative moving direction. That is, after it is determined that there is the allocation target areas which are not yet allocated in the step S100 in FIG. 3, each process of the steps S101 to S103 is performed again. In addition, the object substrate P shown in FIGS. 6A to 13B is redefined as the object substrate P', in which the most left side of the allocation target area F3 is set as the most left end PL' of the object substrate and the most right side of the allocation target area F7 is set as the most right end PR' of the object substrate as shown in FIGS. 14A and 14B. Afterward, the calculation process is performed.

In the step S101 shown in FIG. 3, among the allocation target areas F3, F6, and F7, which are not yet allocated, arranged on the substrate of the object substrate P' in the direction perpendicular to the relative moving direction, the allocation target area F3 positioned in the most left end is allocated to the most left side of the stable exposure area R1. Hereinafter, the process (i.e., the process in the step S102 in FIG. 3) of calculating the temporary arrangement range of the object area P' in which the allocation target areas F3, F6, and F7 can be positioned in the stable exposure areas is performed in order from the one side in the direction perpendicular to the relative moving direction of the object substrate P', that is, in order of the allocation target areas F3, F6, and F7.

In the first place, in FIGS. 14A and 14B for the reference, the temporary arrangement range of the object substrate P', in the direction perpendicular to the relative moving direction is calculated, such that the allocation target area F3 can be positioned in the stable exposure area. When the object substrate P' is positioned between a position in which the most left side of the allocation target area F3 is positioned in the most left side of the stable exposure area R1 as shown in FIG. 14A (i.e., the coordinate of the most left end PL' of the object substrate P' is "0") and a position in which the most right side of the allocation target area F3 is positioned in the most right side of the stable exposure area R1 as shown in FIG. 14B (i.e., the coordinate of the most left end PL' of the object substrate P is "45"), the allocation target area F3 can be positioned in the stable exposure area R1. As a result, the temporary arrangement range of the object substrate P' satisfying the condition that the allocation target area F3 can be positioned in the stable exposure area R1 is "0 to 45."

Figure 15A:
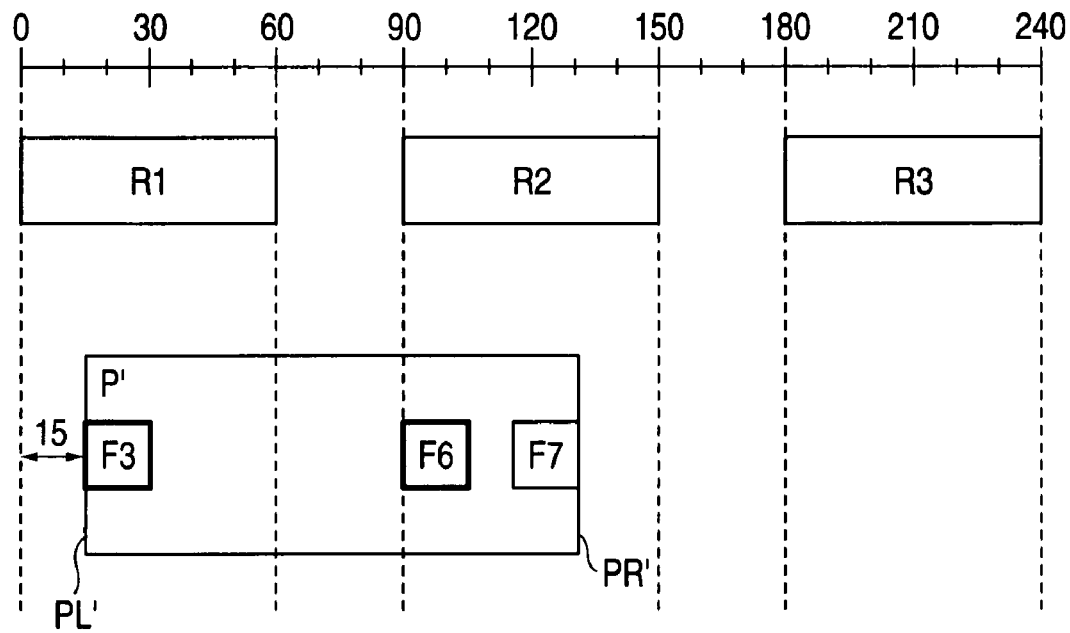
FIGS. 15A and 15B are twelfth exemplary diagrams illustrating the specific example in which the set position of the object substrate is determined according to the embodiment of the invention.
Figure 15B:
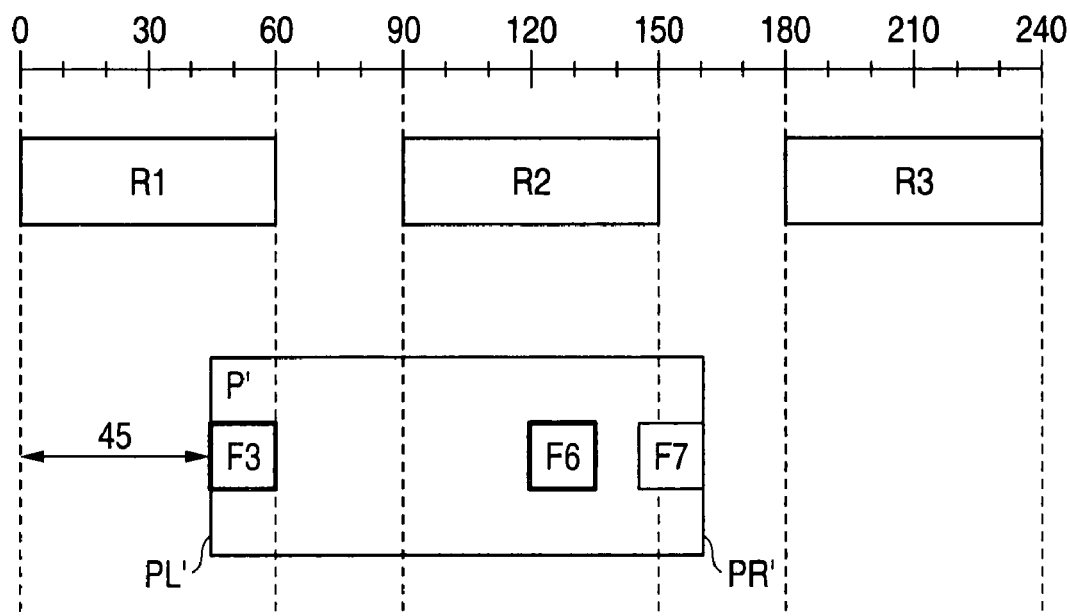

Sequentially, as shown in FIGS. 15A and 15B for reference, the temporary arrangement range of the object substrate P' in the direction perpendicular to the relative moving direction is calculated, such that the allocation target area F6 adjacent to the allocation target area F3 in the direction perpendicular to the relative moving direction can be positioned in the stable exposure area. The temporary arrangement range of the object substrate P' in which the allocation target area F6 can be positioned in the stable exposure area needs to satisfy the condition that the allocation target area F3 is positioned in the stable exposure area R1 as described in FIGS. 14A and 14B. Consequently, the temporary arrangement range is calculated in the range of "0 to 45" which has been already calculated as the temporary arrangement range of the object substrate P'. When the object substrate P' is positioned between a position in which the most left side of the allocation target area F6 is positioned in the most left side of the stable exposure area R2 as shown in FIG. 15A (i.e., the coordinate of the most left end PL' of the object substrate P' is "15") and a position in which the right side of the allocation target area F3 is positioned in the most right side of the stable exposure area R1 as shown in FIG. 15B (i.e., the coordinate of the most left end PL' of the object substrate P' is "45"), the allocation target area F6 can be positioned in the stable exposure area R2, and the allocation target area F3 can be positioned in the stable exposure area R1. As a result, the temporary arrangement range of the object substrate P' satisfying the condition that the allocation target area F6 can be positioned in the stable exposure area R2 is "15 to 45."

Figure 16A:
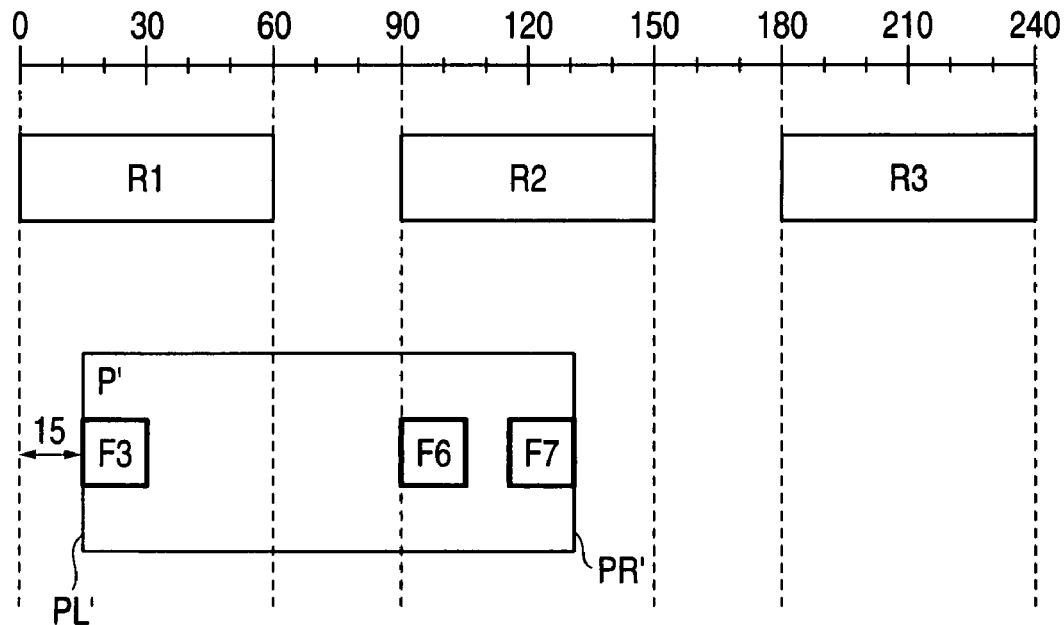
FIGS. 16A and 16B are thirteenth diagrams illustrating the specific example in which the set position of the object substrate is determined according to the embodiment of the invention.
Figure 16B:
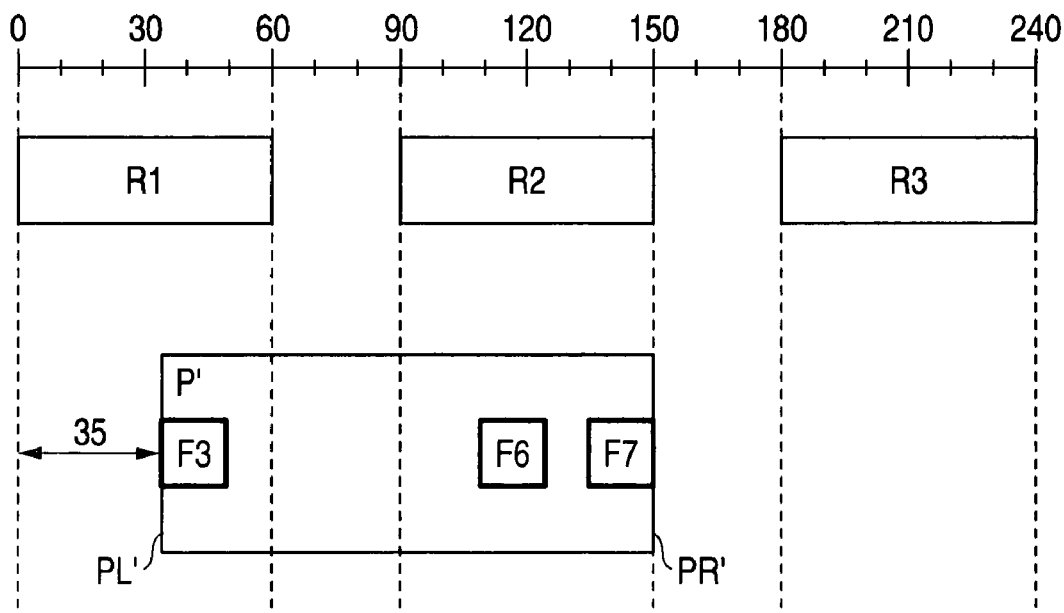

Sequentially, as shown in FIGS. 16A and 16B for reference, the temporary arrangement range of the object substrate P' in the direction perpendicular to the relative moving direction is calculated, such that the allocation target area F7 adjacent to the allocation target area F6 in the direction perpendicular to the relative moving direction can be positioned in the stable exposure area. The temporary arrangement range of the object substrate P in which the allocation target area F7 can be positioned in the stable exposure area needs to satisfy the condition that the allocation target areas F3 and F6 are positioned in the stable exposure areas R1 and R2 respectively, as described in FIGS. 14A, 14B, 15A, and 15B. Consequently, the temporary arrangement range is calculated in the range of "15 to 45" which has been already calculated as the temporary arrangement range of the object substrate P'. That is, when the object substrate P' is positioned between a position in which the most left side of the allocation target area F6 is positioned in the most left side of the stable exposure area R2 as shown in FIG. 16A (i.e., the coordinate of the most left end PL' of the object substrate P' is "15") and a position in which the most right side of the allocation target area F7 is positioned in the most right side of the stable exposure area R2 as shown in FIG. 16B (i.e., the coordinate of the most left end PL' of the object substrate P' is "35"), the allocation target area F7 can be positioned in the stable exposure area R2, and the allocation target areas F3 and F6 can be positioned in the stable exposure areas R1 and R2, respectively. As a result, the temporary arrangement range of the object substrate P' satisfying the condition that the allocation target area F7 can be positioned in the stable exposure area R2 is "15 to 35."

As described above, the calculation process in the step S102 in FIG. 3 is completed with respect to the allocation target areas F3, F6, and F7. As a result, since the final temporary arrangement range of the object substrate P' is calculated as "15 to 35," in the step S103 in FIG. 3, the range of "15 to 35" is determined as the arrangement available range in the direction perpendicular to the relative moving direction of the object substrate P'. When the object substrate P' is installed in the arrangement available range of "15 to 35," the allocation target area F3 is positioned in the stable exposure area R1, and the allocation target areas F6 and F7 are positioned in the stable exposure area R2. Consequently, when the object substrate P' is installed in the arrangement available range of "15 to 35," the allocation target areas F3, F6, and F7 positioned in the stable exposure areas are exposed to light.

In a case where there is any allocation target area which is not yet allocated in this step, though the case is not applied in this embodiment, since the allocation target area which is not yet allocated is not positioned in any stable exposure area, the exposure process is not performed in this step. As for the allocation target area which is not yet allocated, the exposure target substrate P' is shifted again in the direction perpendicular to the relative moving direction. Afterward, the calculation process in the step S102 in FIG. 3 is performed again. That is, in the step S100 of FIG. 3, after it is determined that there is the allocation target area which is not yet allocated, each process of the step S101 to S103 is performed again.

By performing the above-described steps S100 to S103 until there is no allocation target area which is not yet allocated, the set position of the object substrate in which the allocation target areas are all positioned in the stable exposure areas is determined. When the allocation target areas corresponding to the set position of the object substrate are exposed to light in the set position determined in the manner, the defective resolution does not occur on the surface of the object substrate. In addition, it is required that the pattern data needed in the patterning process are corrected in advance in accordance with the set position of the object substrate. By supplying the corrected pattern data to each digital micromirror device through a control unit of the direct patterning apparatus, the patterning process is performed. In addition, the patterning process can be performed collectively after the set position of the object substrate is calculated by the calculation process for all the allocation target areas. Alternatively, the patterning process can be performed separately whenever the set position of the object substrate is calculated by the calculation process for every allocation target area.

In the above-described specific example of the embodiment, the case where the plurality of pieces such as the semiconductor package are attached on the surface of the object substrate and the minute pattern in which the exposure irregularity affects the resolution is included in a part of the piece is described above. However, the invention can be applied to a piece that contains a specific area other than the minute pattern as well. Besides the direct patterning apparatus using the digital micromirror device (DMD), the invention can be also applied to the patterning apparatus using the spatial light modulation element such as LCD arrays.

Figure 17:
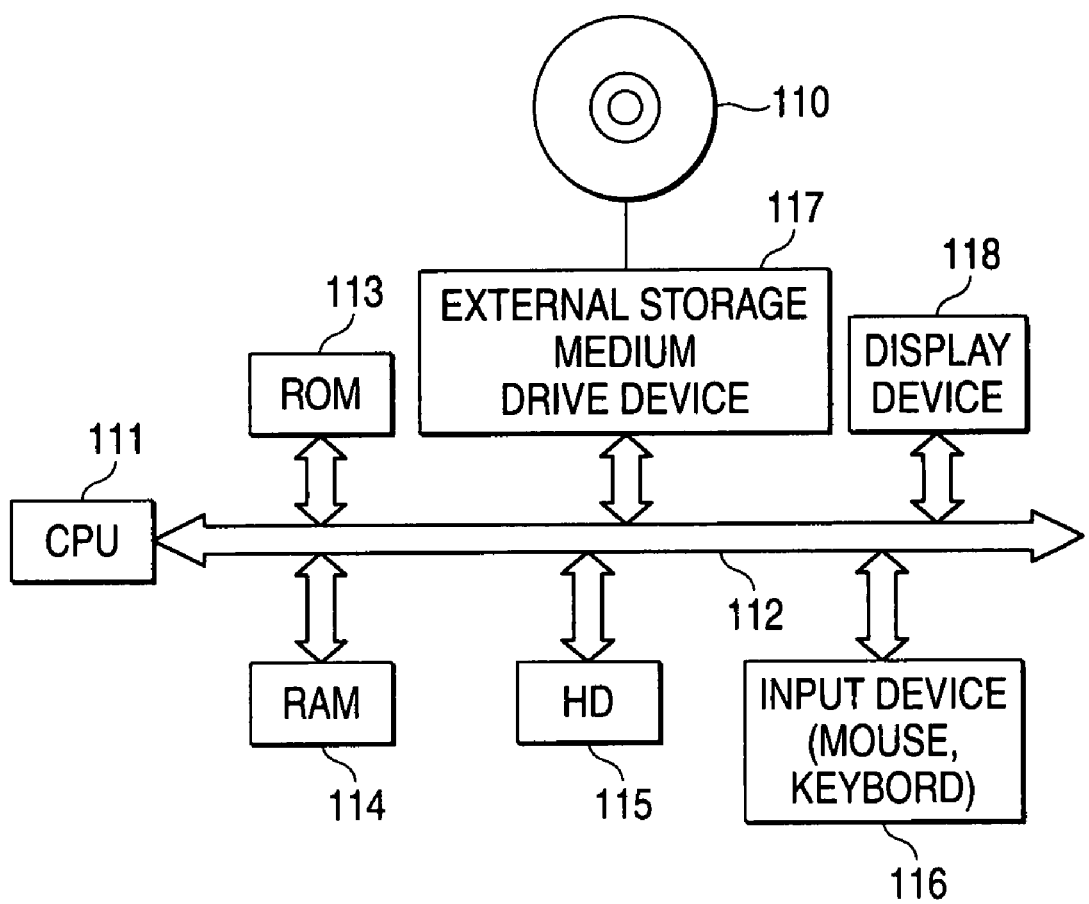
FIG. 17 is a block diagram illustrating the patterning process according to the embodiment of the invention performed by a computer program stored in a computer readable medium.
Figure 18A:
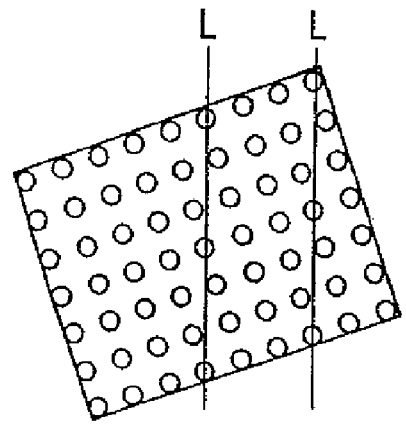
FIGS. 18A to 18D are schematic diagrams illustrating position displacement of spots that can be occurred in a direct patterning apparatus using a digital micromirror device at the time of multiple exposure by micromirrors.
Figure 18B:
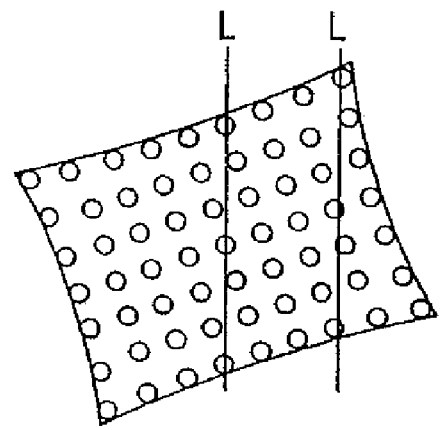
Figure 18C:
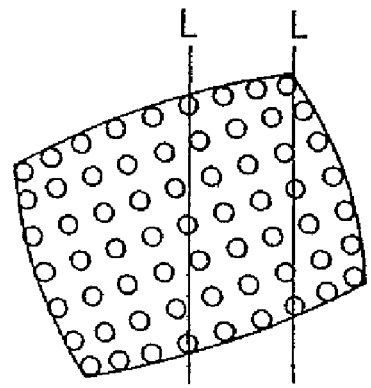
Figure 18D:
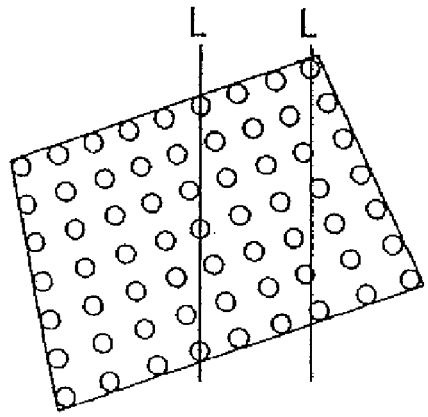
Figure 19:
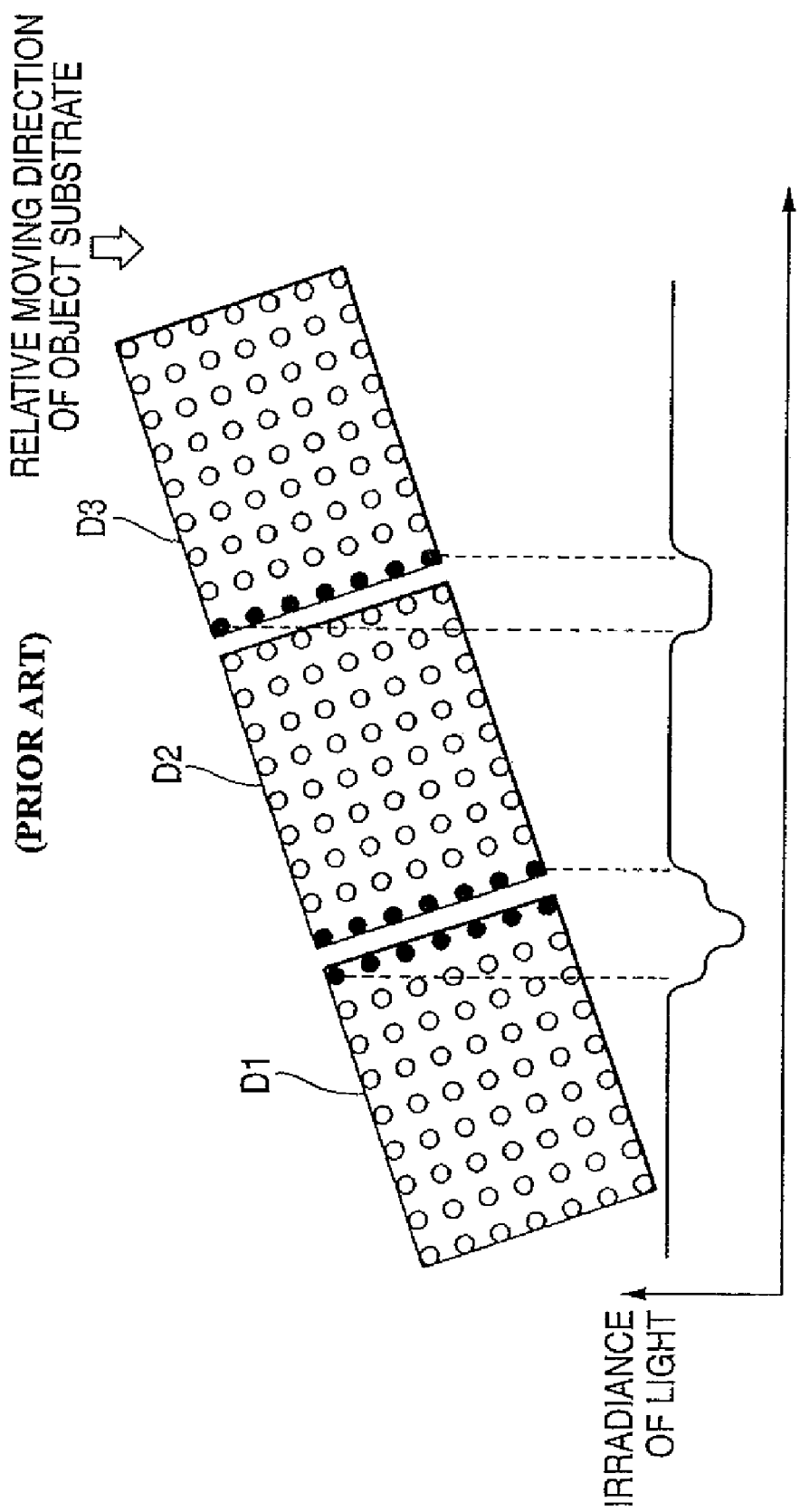
FIG. 19 is a diagram illustrating one example of irradiance distribution of light by the digital micromirror devices in the direct patterning apparatus.
Figure 20:
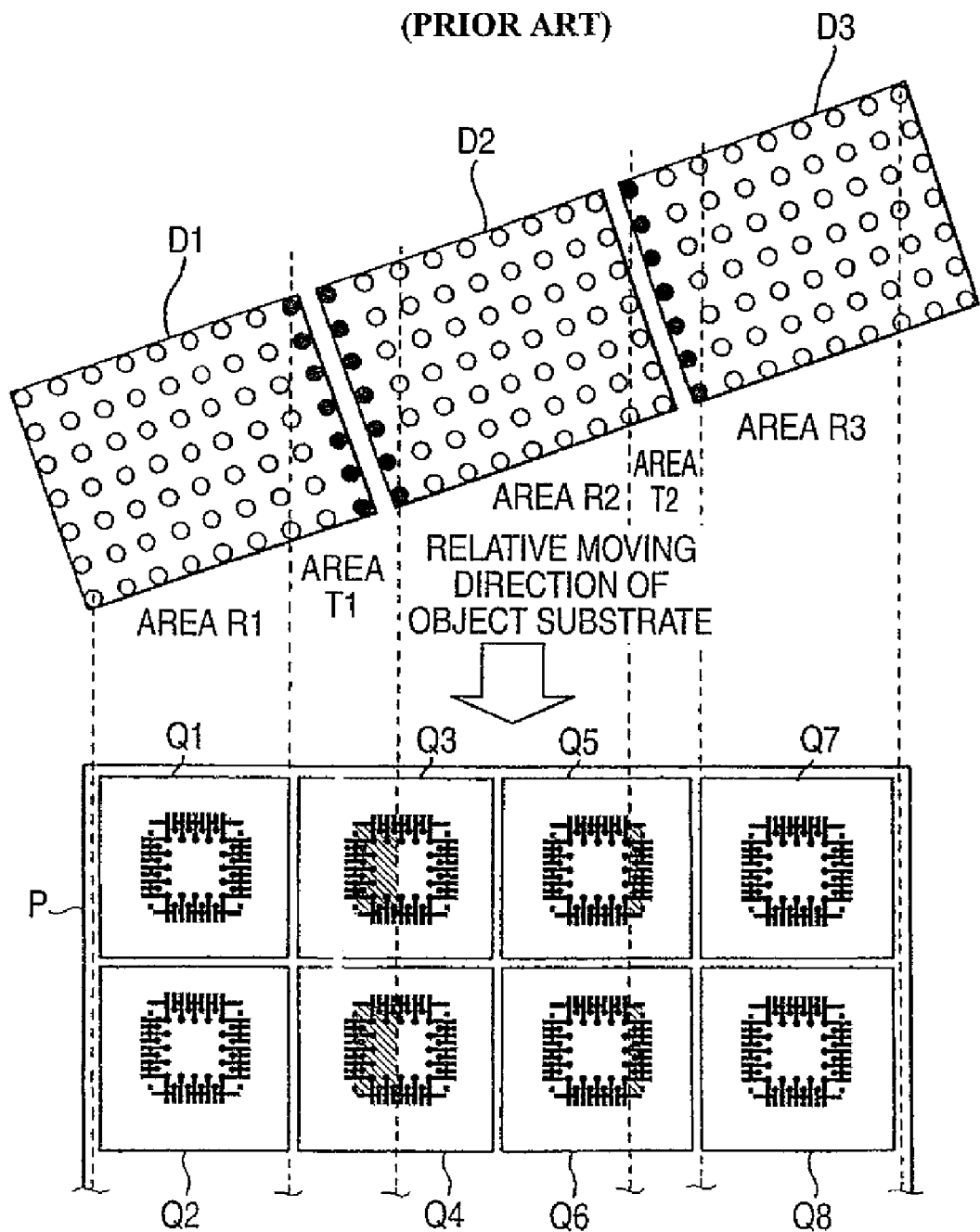
FIG. 20 is a diagram illustrating a relationship between exposure irregularity and defective resolution of the direct patterning apparatus using the digital micromirror device.

The patterning process according to the embodiment of the invention is implemented by using the direct patterning apparatus itself and an arithmetic processing apparatus such as a computer for controlling the direct patterning apparatus. FIG. 17 is a block diagram illustrating the principle of the patterning process according to the embodiment of the invention performed on the basis of a computer program stored in a computer readable medium.

As shown in FIG. 17, the computer program for causing a computer to execute the patterning process according to the embodiment of the invention is stored in a computer readable medium 110 (external storage medium such as a flexible disk and a CD-ROM), and is loaded on a computer having a structure, for example, described below, so as to operate as a control unit of the direct patterning apparatus.

CPU 111 controls the entire control unit of the direct patterning apparatus. To the CPU 111, ROM 113, RAM 114, HD (hard disk device) 115, an input device 116 such as a mouse or a keyboard, an external storage medium drive device 117, and a display device 118 such as LCD, CRT, a plasma display, and an organic EL are connected through a bus 112. The control program of the CPU 111 is stored in the ROM 113.

The program (patterning process program) for causing a computer to execute the patterning process according to the embodiment of the invention is installed (stored) from the computer readable medium 110 to the HD 115. In the RAM 114, a work space in which the CPU 111 performs the patterning process or a space in which a part of the program of performing the patterning process is stored is ensured. Input data, final data, OS (operating system) and the like are stored in advance in the HD 115.

In the first place, when a computer is turned on, the CPU 111 reads the control program from the ROM 113, and further reads the OS from the HD 115 to start the OS. The computer is ready to install the patterning process program from the computer readable medium 110 in this manner.

Next, the computer readable medium 110 is mounted in the external storage medium drive device 117, the control command is inputted from the input device 116 to the CPU 111, and then the patterning process program stored in the computer readable medium 110 is read to be stored in the HD 115 or the like. In this manner, the patterning process program is installed in a computer.

Sequentially, when the patterning process program is started, the computer serves as the control unit of the direct patterning apparatus. An operator can perform the above-described patterning process by operating the input device 116 in accordance with a content and a procedure of work by, for example, an interactive method, displayed on the display device 118. "Data about the set position of the object substrate in the direction perpendicular to the relative moving direction, for every allocation target area" obtained as a result of the process are stored in, for example, the HD 115 so as to be used later or to display the processed result on the display device 118 visually.

In addition, the program stored in the computer readable medium 110 is installed in the HD 115 in the computer as shown in FIG. 17. However, the present invention is not limited to this embodiment. In the present invention, the program can be installed to the computer through information transmission medium such as LAN, or the program may be installed in the HD 115 in advance which is incorporated in the computer.

The invention is applicable to a patterning apparatus, that is, an exposure apparatus, using spatial light modulation elements such as a digital micromirror device (DMD) and an LCD array to perform exposure, in which a pattern is directly patterned on the object substrate (object) of which patterning target area is large. For example, the present invention is applicable to the direct patterning apparatus for performing the patterning process while a sheet-shaped object substrate such as a metal plate, a metal hoop material, wiring substrate or a flexible substrate is sequentially carried.

According to the invention, the direct patterning process by which a defective resolution does not occur on the object substrate and which has high patterning accuracy can be performed with low cost, by using the plurality of spatial light modulation elements arranged to perform the direct patterning process on the entire surface of the object while the object is successively and relatively moving. In addition, critical defect such as circuit pattern shorts or contact failure does not occur in the patterning completed product.

According to the aspect of the invention, the direct patterning apparatus which forms a desired pattern on the surface of the object by exposing the surface of the object to light by using the plurality of spatial light modulation elements installed in the direction perpendicular to the relative moving direction of the object can implement the patterning process with low cost in which the defective resolution does not occur on the surface of the object.

According to the aspect of the invention, there is no need to design the optical system to be mounted on the patterning head with high accuracy. Further, it is possible to reduce labors, time, and cost in the work of assembling or adjusting the direct exposure apparatus. Moreover, the present invention can be applied to the direct patterning apparatus of the related art. For example, the defective resolution can be easily prevented from occurring on the surface of the object, just by loading the computer program which implements the patterning method according to the aspect of the invention, to a computer program for controlling the direct patterning apparatus.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A patterning method for forming a pattern on a surface of an object, the patterning method comprising:

determining an arrangement available range of the object as to a direction perpendicular to a relative moving direction of the object, so that the largest number of a plurality of predetermined areas which is on the surface of the object and is aligned in the direction perpendicular to the relative moving direction of the object is positioned in stable exposure areas each of which is located in a center part of respective exposure areas in the direction perpendicular to the relative moving direction of the object, the exposure areas being defined along the relative moving direction of the object;

setting a set position of the object as to the direction perpendicular to the relative moving direction in the determined arrangement available range, for exposing the predetermined areas positioned in the stable exposure areas to light by a plurality of spatial light modulation elements assigned to the exposure areas respectively; and executing a calculation process for the respective predetermined areas sequentially from one side in the direction perpendicular to the relative moving direction, wherein in the calculation process, a temporary arrangement range of the object as to the direction perpendicular to the relative moving direction, in which the predetermined areas under calculation is positioned in the stable exposure area, is calculated within the temporary arrangement range that is calculated in the preceding calculation process for the other predetermined area that is adjacent to the predetermined area under calculation in the direction perpendicular to the relative moving direction, and the predetermined area that is not positioned in the stable exposure area when the object is temporarily set in the temporary arrangement range calculated in the preceding calculation process is excluded from the calculation process for the temporary arrangement range to be calculated next, and wherein the temporary arrangement range that is finally calculated by executing the calculation process for all of a series of the predetermined areas aligned in the direction perpendicular to the relative moving direction on the surface of the object is determined as the arrangement available range of the object.

2. The patterning method according to claim 1, wherein the determining step is performed again for the predetermined area that is not positioned in the stable exposure area when the object is placed at the set position, in a state where the object is shifted in the direction perpendicular to the relative moving direction, and the set position of the object for exposing the predetermined area to light is newly set in the determined arrangement available range.

3. The patterning method according to claim 1, wherein the predetermined areas exist in respective pieces attached on the surface of the object, and the pattern in the predetermined area is to be formed with a density higher than that of an area other than the predetermined area in the same piece.

4. The patterning method according to claim 1, wherein the predetermined areas are aligned at an approximate regular interval in the direction perpendicular to the relative moving direction on the surface of the object.

5. The patterning method according to claim 1, wherein the stable exposure area is stably exposed to light capable of forming a pattern with high density from the spatial light modulation elements.

6. A computer readable medium having a program including instructions for permitting a computer to execute a patterning process for forming a pattern on a surface of an object, the instructions comprising:

determining an arrangement available range of the object as to a direction perpendicular to a relative moving direction of the object, so that the largest number of a plurality of predetermined areas which is on the surface of the object and is aligned in the direction perpendicular to the relative moving direction of the object is positioned in stable exposure areas each of which is located in a center part of respective exposure areas in the direction perpendicular to the relative moving direction of the object, the exposure areas being defined along the relative moving direction of the object;

setting a set position of the object as to the direction perpendicular to the relative moving direction in the determined arrangement available range, for exposing the predetermined areas positioned in the stable exposure areas to light by a plurality of spatial light modulation elements assigned to the exposure areas respectively; and executing a calculation process for the respective predetermined areas sequentially from one side in the direction perpendicular to the relative moving direction, wherein in the calculation process, a temporary arrangement range of the object as to the direction perpendicular to the relative moving direction, in which the predetermined areas under calculation is positioned in the stable exposure area, is calculated within the temporary arrangement range that is calculated in the preceding calculation process for the other predetermined area that is adjacent to the predetermined area under calculation in the direction perpendicular to the relative moving direction, and the predetermined area that is not positioned in the stable exposure area when the object is temporarily set in the temporary arrangement range calculated in the preceding calculation process is excluded from the calculation process for the temporary arrangement range to be calculated next, and wherein the temporary arrangement range that is finally calculated by executing the calculation process for all of a series of the predetermined areas aligned in the direction perpendicular to the relative moving direction on the surface of the object is determined as the arrangement available range of the object.

7. The computer readable medium according to claim 6, wherein the determining step is performed again for the predetermined area that is not positioned in the stable exposure area when the object is placed at the set position, in a state where the object is shifted in the direction perpendicular to the relative moving direction, and the set position of the object for exposing the predetermined area to light is newly set in the determined arrangement available range.

8. The computer readable medium according to claim 6, wherein the predetermined areas exist in respective pieces attached on the surface of the object, and the pattern in the predetermined area is to be formed with a density higher than that of an area other than the predetermined area in the same piece.

9. The computer readable medium according to claim 6, wherein the predetermined areas are aligned at an approximate regular interval in the direction perpendicular to the relative moving direction on the surface of the object.

10. The computer readable medium according to claim 6, wherein the stable exposure area is stably exposed to light capable of forming a pattern with high density from the spatial light modulation elements.

* * * * *